US006902875B2

(12) United States Patent
Nagahara et al.

(10) Patent No.: US 6,902,875 B2
(45) Date of Patent: Jun. 7, 2005

(54) PHOTOSENSITIVE POLYSILAZANE COMPOSITION, METHOD OF FORMING PATTERN THEREFROM, AND METHOD OF BURNING COATING FILM THEREOF

(75) Inventors: Tatsuro Nagahara, Shizuoka (JP); Hideki Matsuo, Shizuoka (JP)

(73) Assignee: Clariant Finance (BVI) Limited, Tortola (VG)

( * ) Notice: Subject to any disclaimer, the term of this patent is extended or adjusted under 35 U.S.C. 154(b) by 334 days.

(21) Appl. No.: 10/110,656

(22) PCT Filed: Aug. 24, 2001

(86) PCT No.: PCT/JP01/07251

§ 371 (c)(1),
(2), (4) Date: Aug. 28, 2002

(87) PCT Pub. No.: WO02/19037

PCT Pub. Date: Mar. 7, 2002

(65) Prior Publication Data

US 2003/0113657 A1 Jun. 19, 2003

(51) Int. Cl.$^7$ ............................ G03F 7/039; G03F 7/20; G03F 7/30; G03F 7/38; G03F 7/40

(52) U.S. Cl. .................... 430/325; 430/326; 430/270.1; 430/905; 430/914; 430/919; 430/920; 430/921; 430/926; 430/330; 430/328; 430/311; 430/317

(58) Field of Search .......................... 430/270.1, 905, 430/914, 919, 920, 921, 926, 325, 330, 328, 311, 317, 326

(56) References Cited

U.S. PATENT DOCUMENTS

| | | | | |
|---|---|---|---|---|
| 3,892,583 | A | 7/1975 | Winter et al. ................... | 501/92 |
| 4,659,850 | A | 4/1987 | Arai et al. ..................... | 556/409 |
| 4,869,858 | A | 9/1989 | Funayama et al. ........... | 264/626 |
| 5,770,260 | A | 6/1998 | Fukuyama et al. .......... | 427/226 |
| 5,976,618 | A | 11/1999 | Fukuyama et al. .......... | 427/226 |
| 6,190,825 | B1 | 2/2001 | Denzinger et al. ........... | 430/192 |

FOREIGN PATENT DOCUMENTS

| | | |
|---|---|---|
| EP | 0 544 959 | 6/1993 |
| EP | 1 164 435 | 12/2001 |
| JP | 49-69717 | 7/1975 |
| JP | 52-58374 | * 5/1977 |
| JP | 52-058374 | 5/1977 |
| JP | 62-156135 | 4/1987 |
| JP | 62-195024 | 9/1989 |
| JP | 10-186663 | 7/1998 |
| JP | 10-319597 | 12/1998 |
| JP | 11-339799 | * 12/1999 |
| JP | 2000-181069 | * 6/2000 |
| WO | 1 16 4435 A1 | 10/1999 |

OTHER PUBLICATIONS

English translation of JP 52–58374 (Jinno) provided by USPTO.*
Machine–assisted English translation of JP 2000–181069 provided by Japan Patent Office.*
English abstract of JP 11–339799 (Chem. Abstract).*
English abstract for JP 52058374, May 13, 1977.
English abstract for JP 63081122, Apr. 12, 1988.
English abstract for JP 63191832, Aug. 9, 1988.
English abstract for JP 1138107, May 31, 1989.
English abstract for JP 1138108, May 31, 1989.
English abstract for JP 1203429, Aug. 16, 1989.
English abstract for JP 1203430, Aug. 16, 1989.
English abstract for JP 2077427, Mar. 16, 1990.
English abstract for JP 2084437, Mar. 26, 1990.
English abstract for JP 2175726, Jul. 9, 1990.
English abstract for JP 3031326, Feb. 12, 1991.
English abstract for JP 03–320167, Apr. 12, 1991 (See BA above for equivalent in English).
English abstract for JP 4063833, Feb. 28, 1992.
English abstract for JP 5086200, Apr. 6, 1993.
English abstract for JP 5088373, Apr. 9, 1993.
English abstract for JP 5238827, Sep. 17, 1993.
English abstract for JP 5331293, Dec. 14, 1993.
English abstract for JP 6122852, May 6, 1994.
English abstract for JP 6189230, Jul. 8, 1994.
English abstract for JP 6240208, Aug. 30, 1994.
English abstract for JP 6299188, Oct. 25, 1994.
English abstract for JP 6306329, Nov. 01, 1994.
English abstract for JP 6316325, Nov. 15, 1994.
English abstract for JP 7196986, Aug. 1, 1995.
English abstract for JP 10186663, Jul. 14, 1998.
English abstract for JP 10319597, Dec. 4, 1998.
English abstract for JP 2001288270, Oct. 16, 2001.

(Continued)

*Primary Examiner*—Cynthia H. Kelly
*Assistant Examiner*—Sin J. Lee
(74) *Attorney, Agent, or Firm*—Alan P. Kass

(57) ABSTRACT

A finely patterned silica type ceramic film suitable as an inter-layer dielectric is formed in a short time by applying, onto a substrate, a positive working radiation sensitive polysilazane composition comprising a modified poly(sil sesquiazane) having a number average molecular weight of 100 to 100,000 and containing a basic constituent unit represented by the general formula: —[SiR$^6$(NR$^7$)$_{1.5}$]— and other constituent units represented by the general formula: —[SiR$^6{}_2$NR$^7$]— and/or —[SiR$^6{}_3$(NR$^7$)$_{0.5}$]— (R$^6$ and R$^7$ independently represent a hydrogen atom, a C$_{1-3}$ alkyl group or a substituted or unsubstituted phenyl group) in a ratio of 0.1 to 100 mol-% to said basic constituent unit, a photo acid generator and preferably a water-soluble compound as a shape stabilizer, then patternwise exposing the resultant coating film, subjecting the exposed part of the coating film to moistening treatment, developing it with an aqueous alkali solution, wholly exposing the coating film to light and moistening treatment again, followed by burning treatment.

14 Claims, 5 Drawing Sheets

OTHER PUBLICATIONS

Dietmar Seyferth, et al., "High–yield synthesis of Si3N4/SiC Ceramic Materials by Pyrolysis of a Novel Polyorganosilazane", Communications of the American Ceramic Society, Jul. 1984, p. c–132–c–133.

Dietmar Seyferth, et al., "A liquid silazane precursor to silicon nitride", Communications of the American Ceramic Society, Jan. 1983, p. c–13–c–14.

V.E. Gunn, et al., Polym. Prepr., Am. Chem. Soc., Div. Polym. Chem., 10, 1984, pp. 26–26.

* cited by examiner

PHOTOSENSITIVE POLYSILAZANE COMPOSITION, METHOD OF FORMING PATTERN THEREFROM, AND METHOD OF BURNING COATING FILM THEREOF

TECHNICAL FIELD

This invention relates to a method of forming a patterned polysilazane film by using a radiation sensitive polysilazane composition, a method of forming a silica type ceramic film by burning a patterned radiation sensitive polysilazane coating film, and a radiation sensitive polysilazane composition to be used preferably in these methods.

BACKGROUND ART

In various fields including manufacture of semiconductor devices and liquid crystal displays, positive or negative working photoresists have been used for fine processing or patterning. As such photoresists, there are conventionally known a positive working radiation sensitive composition comprising a novolak resin and a quinone diazide photosensitizer, a chemically amplified positive or negative working radiation sensitive composition, and a negative working resist such as a polyvinyl cinnamate-based radiation sensitive composition, a bisazide-rubber-based radiation sensitive composition, and a photopolymerization type radiation sensitive composition, etc. In such photoresists, there are required various characteristics depending on their intended use. For example, in processing of semiconductor devices, there are required characteristics such as high sensitivity, high resolution and etching resistance.

On the other hand, various patterned films including an inter-layer dielectric have been used in semiconductor devices, liquid crystal displays, printed circuit substrates, etc. These patterned film is formed generally by applying film-forming organic or inorganic materials or depositing these materials from a gaseous phase to form a coating and then etching the coating through a patterned photoresist. If there is necessity for forming a fine pattern by this etching, gaseous etching is generally used. However, the gaseous etching is problematic because an apparatus used is expensive and the rate of processing is low.

Further, in the production step of semiconductor devices or the like (e.g. a vapor deposition step of wire by CVD), the devices are exposed to high temperatures at higher than 400° C. Accordingly, when organic materials are used as an inter-layer dielectric in the devices exposed to such high temperatures, it can not be opposed satisfactorily in respect of heat resistance. Because of this, the use of inorganic materials is desired as the materials such as an inter-layer dielectric. As the inorganic materials, silica type ceramic films are often used by the reason why it has superior not only in heat resistance but also in abrasion resistance, corrosion resistance, insulating properties, transparency, etc.

Conventionally, such patterned silica type ceramic film is formed generally by etching of a ceramic film using a patterned photoresist as an etching mask, and is economically problematic. Accordingly, there is a demand for a method of forming a finely patterned inter-layer dielectric without using gaseous etching.

For this demand, a method of forming a ceramic film pattern is proposed which comprises applying a radiation sensitive polysilazane composition to form a radiation sensitive polysilazane coating film, exposing and developing the coating film to form a patterned polysilazane film, converting the patterned polysilazane film into a silica type ceramic film. For example, JP-A 5-88373 describes a method of forming a ceramic film pattern which comprises applying a polysilazane-containing coating solution onto a substrate to form a coating film thereon, patternwise irradiating the coating film with UV rays in an oxidizing atmosphere to cure the portion exposed to UV rays, removing a portion not exposed to UV rays, and converting the patterned polysilazane film into a silica type ceramic film. The polysilazane-containing coating solution described above can be regarded as a negative working photoresist because the exposed portion cures and remains after development.

On the other hand, fine processing of semiconductor devices or the like is advancing. As a result, a positive working material, as a resist, with high resolution and high etching resistance such as oxygen plasma resistance is desired. Further, when the patterned coating is used as a remaining inter-layer dielectric, it is desired that the coating materials satisfy not only the aforementioned requirements for fine processing but also excellent properties such as high heat resistance, low dielectric constant and transparency required for the inter-layer dielectric. For these demands, the present inventors proposed a positive working radiation sensitive polysilazane composition comprising a polysilazane and a photo acid generator; a method of forming a patterned polysilazane film which comprises applying said radiation sensitive polysilazane composition to form a coating film, patternwise irradiating the coating film, dissolving and removing the irradiated part of the coating film to form a patterned polysilazane film; and a method of forming a patterned insulating film which comprises leaving said patterned polysilazane film in the ambient atmosphere or burning the film thereby converting it into a silica type ceramic film in Japanese Patent Application No. Hei 11-283106 (JP-A 2000-181069).

In addition, the present inventors proposed a positive working radiation sensitive polysilazane composition having improved storage stability by use of a modified poly(sil sesquiazane) in Japanese Patent Application No. Hei 12-108023.

In the method of using these positive working radiation sensitive polysilazane compositions, an acid is formed in the light-exposed portion of the radiation sensitive polysilazane coating film. By the acid formed, Si—N linkages in the polysilazane are cleaved and then react with $H_2O$ molecules to form silanol (Si—OH) linkages, whereby decomposition of the polysilazane occurs. In these prior art techniques, however, the treatment method described specifically as a method of decomposing the polysilazane is a method of bringing the exposed radiation sensitive polysilazane film into contact with water.

These proposed positive working radiation sensitive polysilazane compositions have higher, resolution than that of the negative working radiation sensitive polysilazane compositions, but it is necessary to improve the resolution in order to cope with fine patterning. Further, the light-exposed radiation sensitive polysilazane composition is contacted with water to decompose the polysilazane. Possibly because the decomposition of the polysilazane proceeds only in the vicinity of the surface of the film of the radiation sensitive polysilazane composition, the coating film in the exposed portion is not sufficiently removed under some decomposition conditions by subsequent development with an aqueous alkali solution, and development residues may remain on the pattern after development. In addition, there is another problem that the adhesion of the radiation sensitive polysilazane coating film to the substrate is not sufficient. Accordingly, a method of decomposing a radiation sensitive polysilazane film free of aforementioned problems is also regarded. Further, when the radiation sensitive polysilazane coating film is converted by burning into a silica type ceramic film, oxidation of the polysilazane does not sufficiently proceed by merely heating the polysilazane coating film. As a consequence of this, the resultant silica type ceramic film has a large number of Si—N linkages of polysilazane in the coating film, thus making it difficult to form a film having a sufficiently low dielectric constant required for an inter-layer dielectric. There is a further problem that when a large number of Si—N linkages remain in the silica type ceramic film, the film easily absorbs moisture to form a film having unstable physical properties. Accordingly, when burning the radiation sensitive polysilazane coating film, a method of burning a radiation sensitive polysilazane coating film is also demanded, wherein the polysilazane in the coating film can be converted easily and sufficiently into silica type ceramic film and give a silica type ceramic film excellent in characteristics such as dielectric constant and free of residual Si—N linkages in the film.

In view of these circumstances, an object of this invention is to provide a method of forming a patterned polysilazane coating by use of a radiation sensitive polysilazane composition, wherein the polysilazane in the radiation sensitive polysilazane composition after exposure can be decomposed in a short time to give a patterned polysilazane film excellent in adhesion to a substrate and free of development residues on the pattern after development.

Further, an object of this invention is to provide a method of burning a radiation sensitive polysilazane coating film wherein oxidation of the polysilazane sufficiently proceeds even by simple heating so that no or few Si—N linkages exist in the film.

Further, an object of this invention is to provide a radiation sensitive polysilazane composition, a method of forming a patterned radiation sensitive polysilazane coating, and a method of burning a radiation sensitive polysilazane coating film, wherein a silica type ceramic film with a low dielectric constant, excellent in heat resistance, abrasion resistance, corrosion resistance, insulating properties and transparency and useful as an inter-layer dielectric can be formed.

Further, an object of this invention is to provide a radiation sensitive polysilazane composition having high resolution.

The present inventors made extensive study for achieving these objects, and as a result, obtained the following knowledge. That is, when forming a patterned polysilazane film by use of a positive working radiation sensitive composition such as a radiation sensitive polysilazane composition comprising a polysilazane and a photo acid generator, the polysilazane can be decomposed in a short time, and development residues do not remain on the pattern after development by contacting the exposed radiation sensitive polysilazane coating film with a water vapor-containing gas, that is, subjecting to moistening treatment; the decomposition time can be further reduced by increasing the content of water vapor in the gas used or by heating the radiation sensitive polysilazane coating film at the time of moistening treatment; the partial pressure of water vapor in the atmosphere for moistening treatment can be further increased by relaxation of the conditions of moisture condensation on the surface of the film in heating the film, whereby the time required for decomposition of the polysilazane can be further reduced; and the adhesion of the polysilazane coating film to the substrate is also improved by heating during development.

Further, the present inventors found that when the radiation sensitive polysilazane coating film is burned, conversion of the coating film into silica type ceramic film can be conducted easily and sufficiently by exposing the coating film and subjecting the resultant film to the moistening treatment before burning, to give a silica type ceramic film excellent in properties and free of Si—N linkages therein.

Further, the present inventors found that resolution can be increased by adding a water-soluble compound as a shape stabilizer to the radiation sensitive composition comprising a specific modified poly(sil sesquiazane) and a photo acid generator, and this radiation sensitive composition can form a finely patterned inter-layer dielectric excellent in dielectric constant, insulating properties and mechanical properties after burning.

This invention is based on these findings.

DISCLOSURE OF THE INVENTION

This invention relates to a method of forming a polysilazane film, a method of burning a radiation sensitive polysilazane coating film, and a radiation sensitive polysilazane composition which have the following constitution:

[1] A method of forming a patterned polysilazane film by exposing and then developing a coating film of a radiation sensitive polysilazane composition, wherein the exposed radiation sensitive polysilazane coating film is subjected to moistening treatment and then developed.

[2] The method of forming a patterned polysilazane film according to item [1] above, wherein the radiation sensitive polysilazane coating film is heated at the time of the moistening treatment.

[3] A method of burning a radiation sensitive polysilazane coating film, wherein the steps of exposing with light and moistening the radiation sensitive polysilazane coating film are provided as pretreatment steps for burning.

[4] The method of burning a radiation sensitive polysilazane coating film according to item [3] above, wherein the radiation sensitive polysilazane coating film has been patterned.

[5] The method of burning a radiation sensitive polysilazane coating film according to item [3] above, wherein the radiation sensitive polysilazane coating film is heated at the time of the moistening treatment.

[6] A radiation sensitive polysilazane composition comprising a modified poly(sil sesquiazane) having a number average molecular weight of 100 to 100,000 and containing a basic constituent unit represented by the general formula: —[SiR$^6$(NR$^7$)$_{1.5}$]— and other constituent units represented by the general formula: —[SiR$^6{}_2$NR$^7$]— and/or —[SiR$^6{}_3$(NR$^7$)$_{0.5}$]— (in the aforementioned formulae, R$^6$ independently represents a C$_{1-3}$ alkyl group or a substituted or unsubstituted phenyl group and R$^7$ independently represents a hydrogen atom, a C$_{1-3}$ alkyl group or a substituted or unsubstituted phenyl group) in a ratio of 0.1 to 100 mol-% to said basic constituent unit, a photo acid generator, and a water-soluble compound as a shape stabilizer.

[7] The radiation sensitive polysilazane composition according to item [6] above, wherein the photo acid generator is ones selected from the group consisting of a sulfoxime type compound and a triazine type compound.

[8] The radiation sensitive polysilazane composition according to item [6] or [7] above, which further comprises a dissolution inhibitor.

[9] The radiation sensitive polysilazane composition according to item [8] above, wherein the dissolution inhibitor is ones selected from the group consisting of t-butoxycarbonylated catechol, t-butoxycarbonylated hydroquinone, t-butyl ester of benzophenone-4,4'-dicarboxylic acid, and t-butyl ester of 4,4'-oxydibenzoic acid, and is contained in an amount of 0.1 to 40% by weight relative to the radiation sensitive polysilazane composition.

[10] The radiation sensitive polysilazane composition according to any one of items [6] to [9] above, wherein the water-soluble compound is a compound with a nitro group.

[11] The radiation sensitive polysilazane composition according to any one of items [6] to [10] above, wherein the water-soluble compound is a compound having a carbonate.

[12] The radiation sensitive polysilazane composition according to any one of items [6] to [10] above, wherein the water-soluble compound is a polymer.

[13] The radiation sensitive polysilazane composition according to any one of items [6] to [12] above, which further comprises a sensitizing dye or pigment (hereinafter, refer as to sensitizing dye).

[14] The radiation sensitive polysilazane composition according to item [13] above, wherein the sensitizing dye is ones selected from the group consisting of coumarin, ketocoumarin, derivatives thereof and thiopyrylium salts.

[15] The radiation sensitive polysilazane composition according to any one of items [6] to [14] above, which further comprises an oxidization catalyst.

[16] The radiation sensitive polysilazane composition according to item [15] above, wherein the oxidization catalyst is palladium propionate.

[17] The radiation sensitive polysilazane composition according to any one of items [6] to [16] above, wherein the radiation sensitive polysilazane composition is used as an inter-layer dielectric.

[18] A method of forming a patterned inter-layer dielectric, which comprises forming a coating film of a radiation sensitive polysilazane composition comprising a modified poly(sil sesquiazane) having a number average molecular weight of 100 to 100,000 containing a basic constituent unit represented by the general formula: —[SiR$^6$(NR$^7$)$_{1.5}$]— and other constituent units represented by the general formula: —[SiR$^6{}_2$NR$^7$]— and/or —[SiR$^6{}_3$(NR$^7$)$_{0.5}$]— (in the aforementioned formulae, R$^6$ independently represents a C$_{1-3}$ alkyl group or a substituted or unsubstituted phenyl group and R$^7$ independently represents a hydrogen atom, a C$_{1-3}$ alkyl group or a substituted or unsubstituted phenyl group) in a ratio of 0.1 to 100 mol-% to said basic constituent unit, a photo acid generator, and a water-soluble compound as a shape stabilizer, patternwise irradiating the coating film, dissolving and removing the irradiated part of the coating film, and leaving the residual patterned coating film in the ambient atmosphere or burning the coating film.

The patterned polysilazane film formed by the method of this invention can be used directly as e.g. an etching resist or a patterned coating of a constituent unit in devices such as display device. Because the radiation sensitive polysilazane composition to be used in the method of this invention is a positive working composition, it has higher resolution. Further it has also higher resistance to oxygen plasma than that of conventional resists based on organic materials. In addition, the silica type ceramic film formed by the burning method of this invention is a film excellent in heat resistance and having low dielectric constant and high transparency, etc., and thus it can be used particularly preferably as an inter-layer dielectric.

According to this invention, by adding a water-soluble compound as a shape stabilizer to a radiation sensitive polysilazane composition comprising a specific modified poly(sil sesquiazane) and a photo acid generator as described in item [6] above, the resolution of patterning by light is significantly improved.

Further, by leaving for a long time or burned a coating film formed from the radiation sensitive polysilazane composition described in items [6] to [17] above, a patterned silica type ceramic film suitable as an inter-layer dielectric and having excellent properties such as high heat resistance, low dielectric constant, and high transparency can be obtained.

In addition, a sensitizing dye may be contained in the radiation sensitive polysilazane composition thereby enabling patterning using an inexpensive light source such as a high-pressure mercury lamp.

Moreover, an oxidization catalyst may be contained in the radiation sensitive polysilazane composition containing the sensitizing dye, whereby the sensitizing dye can be decomposed at the time of burning the patterned coating film, and a colorless and transparent silica type ceramic film useful as an inter-layer dielectric in a liquid crystal display or the like can be obtained.

Furthermore, by adding a pigment to the radiation sensitive polysilazane composition in the present invention, a color filter and black matrix superior in heat resistance, insulating properties and hardness and excellent in accuracy of pattern can be prepared.

DETAILED DESCRIPTION OF THE INVENTION

Figure 1:
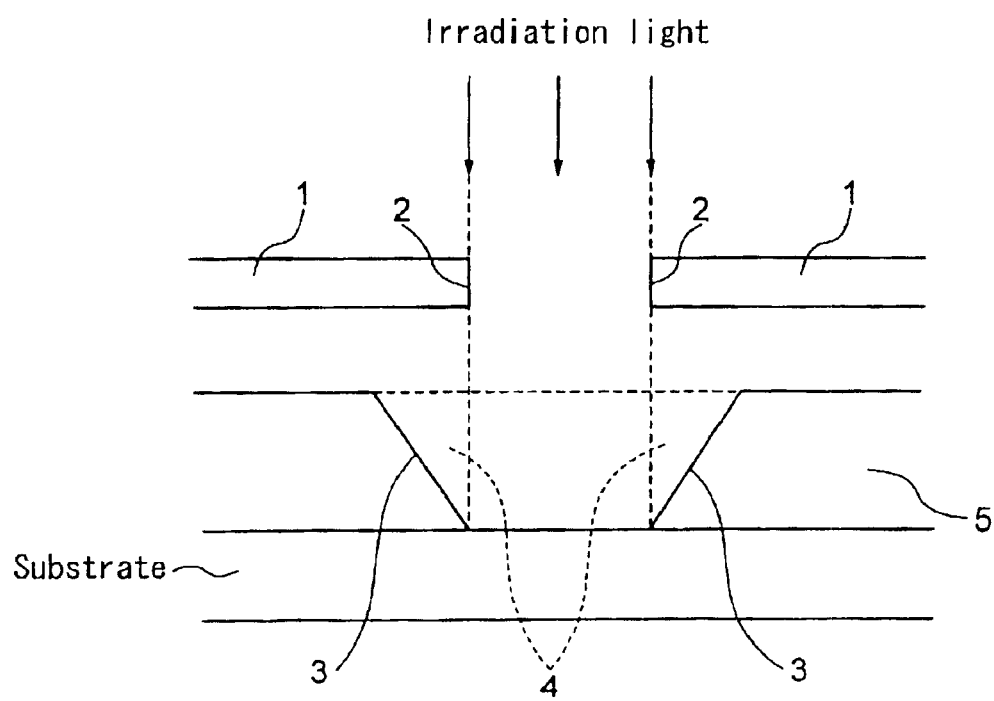
FIG. 1 is a schematic sectional view showing the shape of a side wall of a pattern section of the radiation sensitive polysilazane composition which does not contain a water-soluble compound as shape stabilizer.

Hereinafter, this invention is described in detail.

A method of forming a patterned polysilazane film according to the present invention comprises, but is not limited to;

(a) a coating film-forming step of forming a coating film on a substrate by applying or printing the radiation sensitive polysilazane composition onto the substrate, (b) an exposure step of irradiating the coating film with patterned light, (c) a moistening treatment step of bringing the patternwise-exposed substrate heated if necessary into contact with a gas containing water vapor, to decompose the polysilazane, and (d) a development step of dissolving and removing the light-irradiated portion of the coating film.

Hereinafter, the method of forming a patterned polysilazane film according to this invention is described in detail by reference to this exemplified method.

First, in the method of forming a patterned polysilazane film according to this invention, there are used, as a radiation sensitive composition, a radiation sensitive composition functioning as a positive type such as a radiation sensitive polysilazane composition comprising a polysilazane and a photo acid generator.

Typical examples of the polysilazane used in this positive working radiation sensitive polysilazane composition are as follows;

(A) A polysilazane having a number average molecular weight of 100 to 50,000 having a skeleton represented by the general formula:

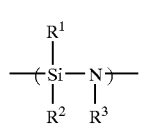

(I)

wherein $R^1$, $R^2$ and $R^3$ independently represent a hydrogen atom, an alkyl group, an alkenyl group, a cycloalkyl group, an aryl group, other groups wherein an atom bound directly to the silicon or nitrogen is carbon, an alkylsilyl group, an alkylamino group or an alkoxyl group, or a modified product thereof.

(B) A poly(silsesquiazane) having a number average molecular weight of 100 to 100,000 having a skeleton represented by the general formula:

(II)

wherein $R^4$ and $R^5$ independently represent a hydrogen atom, an alkyl group, an alkenyl group, a cycloalkyl group, an aryl group which may have a substituent group, other groups wherein a atom bound directly to the silicon or nitrogen is carbon, an alkylsilyl group, an alkylamino group or an alkoxyl group, and n is an arbitrary integer, or a modified product thereof.

(C) A polyorganosiloxazane having a number average molecular weight of 300 to 100,000 containing —(RSiN$_3$)—, —(RSiN$_2$O)—, —(RSiNO$_2$)— and —(RSiO$_3$)— as main repeating units, wherein R is an alkyl group, an alkenyl group, a cycloalkyl group, an aryl group, an alkylamino group or an alkylsilyl group.

Preferable examples of the modified product of the poly (sil sesquiazane) described in (B) above include a modified poly(sil sesquiazane) represented by the following (D).

(D) A modified poly(sil sesquiazane) having a number average molecular weight of 100 to 100,000 containing a basic constituent unit represented by the general formula:

(III)

and other constituent units represented by the general formula:

(IV)

and/or

(V)

(in aforementioned formulae, $R^6$ independently represent a $C_{1-3}$ alkyl group or a substituted or unsubstituted phenyl group, $R^7$ independently represent a hydrogen atom, a $C_{1-3}$ alkyl group or a substituted or unsubstituted phenyl group), wherein the content of the other constitution unit being 0.1 to 100 mol-%, preferably 0.5 to 40 mol-% and more preferably 1 to 20 mol-% to the basic constituent unit.

In this modified poly(sil sesquiazane), the other constituent units are bound at random to the basic constituent units. In the modified poly(sil sesquiazane), specific groups of $R^6$ and $R^7$ can be selected independently, and therefore these groups may be the same or different between the basic constituent units or between the basic constituent unit and the other constituent unit in a polymer. For example, in the basic constituent units, a part of $R^6$ groups may be methyl while the remainder may be phenyl, and a part of $R^7$ groups may be hydrogen while the remainder may be methyl; $R^6$ group in the basic constituent unit may be methyl while $R^6$ group in the other constituent unit may be methyl or phenyl and $R^7$ group in the basic constituent units may be hydrogen while $R^7$ group in the other constituent units may be hydrogen or methyl; and so on. Preferably, $R^6$ groups in both the basic constituent unit and other constituent unit are methyl or phenyl group, most preferably methyl group. Preferably, $R^7$ groups in both the basic constituent unit and other constituent unit are hydrogen.

In the modified poly(sil sesquiazane) described in (D) above, when the constituent unit of the general formula (IV) only is contained as the other constituent units, the ratio of the constituent unit of the general formula (IV) to the above basic constituent unit is preferably 0.1 to 100 mol-%, more preferably 1 to 20 mol-%. When the constituent unit of the general formula (V) only is contained as the other constituent unit, the ratio of the constituent units of the general formula (V) to the above basic constituent unit is preferably 0.1 to 50 mol-%, more preferably 0.5 to 20 mol-%. When the ratio of the other constituent unit is less than 0.1 mol-%, the stability of the resultant polymer itself is lowered, and the polymer molecules may be mutually polymerized during storage. On the other hand, when the ratio of the other constituent unit is greater than 100 mol-%, the molecular weight of the resultant polymer is not sufficiently increased, and thus its coating is undesirably fluidized.

The number average molecular weight of the modified poly(sil sesquiazane) described in (D) above is in the range of 100 to 100,000, preferably 500 to 5000. If the number average molecular weight of the modified poly(sil sesquiazane) is lower than 100, the coating film is fluidized, while if the number average molecular weight is greater than 100,000, the poly(sil sesquiazane) is hardly dissolved in a solvent, so either case is not preferable.

In this invention, as is mentioned above, the word "polysilazane" is used as the one containing poly(sil sesquiazane), polyorganosiloxazane and the like.

In this invention, the polysilazane may naturally be one kind of polysilazane or two or more kinds of polysilazane, or may be a copolymer of a polysilazane with another polymer or a mixture of a polysilazane and another polymer or compound. The polysilazane used includes the one having a linear, cyclic or cross-linked structure, or the one having a plurality of these structures in the molecule, and these polysilazanes can be used alone or as a mixture thereof. As these polysilazanes, perhydropolysilazanes are preferable in respect of the hardness and denseness of the resultant film, and organopolysilazanes are preferable in respect of flexibility. Depending on the intended use, selection of these polysilazanes can be conducted suitably by those skilled in the art.

The polysilazanes described above are known or can be produced by a known method. Specifically, production of polysilazanes is described in e.g. JP-B 63-16325, JP-A 61-89230, JP-A 62-156135, D. Seyferthetal.: Communication of Am. Cer. Soc., C-13, January (1983), Polym. Prepr., Am. Chem. Soc., Div. Polym. Chem., 25, 10 (1984), etc.

Further, the polysilazanes having a cross-linked structure in the molecule may be those reported in JP-A 49-69717, D. Seyferth et al.: Communication of Am. Cer. Soc., C-132, July (1984) or polymetalosilazanes containing a metal atom in the structure.

Besides, the following polysilazanes can be similarly used: the polysiloxazanes whose repeating units are represented by $[(SiH_2)_n(NH)_m]$ and $[(SiH_2)_rO]$ (wherein n, m and r each represent 1, 2 or 3) as reported in JP-A 62-195024; the polyborosilazanes excellent in heat resistance produced by reacting a boron compound with a polysilazane as reported in JP-A 2-84437; the polymetalosilazanes produced by reacting a polysilazane with a metal alkoxide as reported in JP-A 63-81122, JP-A 63-191832 and JP-A 2-77427; the inorganic silazane polymers having high molecular weight or modified polysilazanes having an increased molecular weight as reported in JP-A 1-138108, JP-A 1-138107, JP-A 1-203429 and JP-A 1-203430, or having improvements in hydrolysis resistance as reported in JP-A 4-63833 and JP-A 3-320167; the copolymerized polysilazanes advantageous for forming thick film and having organic components introduced into polysilazanes as reported in JP-A 2-175726, JP-A 5-86200, JP-A 5-331293 and JP-A 3-31326; and the polysilazanes to be converted into ceramics at lower temperatures and capable of application onto plastics or metals such as aluminum, to which a catalytic compound has been added for promoting conversion of polysilazanes into ceramics, as reported in JP-A 5-238827, JP-A 6-122852, JP-A 6-299188, JP-A 6-306329, JP-A 6-240208 and JP-A 7-196986.

The polysilazane which can be used preferably in this invention is poly(sil sesquiazane) having a number average molecular weight of 100 to 100,000, preferably 300 to 10,000 and having mainly a skeleton represented by the general formula (II) above, or a derivative thereof. Further, more preferred poly(sil sesquiazane) is polymethylsilazane wherein $R^4$ is a methyl group and $R^5$ is a hydrogen atom in the formula (II), or polyphenylsilazane wherein $R^4$ is a phenyl group and $R^5$ is a hydrogen atom in the formula (II). Such polysilazanes can be easily obtained by using $R^4SiCl_3$ as a starting material in ammonolysis in synthesis of usual polysilazanes. For the ammonolysis in synthesis of polysilazanes, reference is made to e.g. JP-B 63-16325.

The polyorganosiloxazane mentioned in (C) above is also a polysilazane used preferably in the invention. This polyorganosiloxazane can be produced by reacting an organic halosilane represented by the general formula $R_nSiX_{4-n}$ (wherein R is an alkyl group, an alkenyl group, a cycloalkyl group, an aryl group, an alkylamino group or an alkylsilyl group, X is a halogen atom, and n is 1 or 2) with ammonia and water. Such polyorganosiloxazane can give a burned film with a low dielectric constant even when treated at high temperatures, so it is useful particularly as a precursor of inter-layer dielectric. Another advantage of the polyorganosiloxazane is that by changing the content of oxygen in the main chain, the relative dielectric constant of the resultant burned film can be regulated to achieve a desired relative dielectric constant easily. For a detailed description of such polyorganosiloxazane and a method of producing the same, reference is made to Japanese Patent Application No. Hei 10-528633 (WO98/029475).

In this invention, the modified poly(sil sesquiazane) described in (D) above can be used particularly preferably as the polysilazane. This modified poly(sil sesquiazane) can be easily obtained by using the starting materials $R^6SiCl_3$, $R^6_2SiCl_2$ and/or $R^6_3SiCl$ in ammonolysis in synthesis of conventional polysilazanes, wherein the latter two materials are used in a molar ratio corresponding to the content of the other constituent units. For example, when the unit of the general formula $—[SiR^6_2NR^7]—$ is contained in an amount of 20 mol-% as the other constituent unit, starting silane materials containing 20 mol-% $R^6_2SiCl_2$ mixed with $R^6SiCl_3$ may be subjected to ammonolysis, and when the units of the general formula $—[SiR^6_3(NR^7)_{0.5}]—$ are contained in an amount of 10 mol-% as the other constituent units, 10 mol-% $R^6_3SiCl$ may be mixed with $R^6SiCl_3$. For a detailed description of ammonolysis in synthesis of polysilazanes, reference is made to e.g. JP-B 63-16325.

The modified poly(sil sesquiazane) described in (D) above is highly stable and substantially free from further polymerization during storage, so its molecular weight is prevented from being increased. Though not bound by a specific theory, the reason for preventing an increase in the molecular weight of this polymer is estimated as follows. The polymer consisting exclusively of trifunctional basic constituent units has a large number of distorted cyclic structures in the molecule, thus permitting the structures to be cleaved during storage and the cleaved sites to be bound again to other similarly cleaved molecules to increase the molecular weight; however, when the bifunctional and/or monofunctional constituent units are introduced into the trifunctional basic units, the distorted cyclic structures are decreased thereby making occurrence of such cleavage and re-binding difficult, to prevent an increase in the molecular weight of the polymer.

The radiation sensitive composition of this invention or used in this invention includes a photo acid generator. The photo acid generator is excited directly by irradiation with light in its inherent radiation sensitive wavelength range, or when a sensitizing dye is used, the photo acid generator is excited indirectly by light in a wavelength range where the sensitizing dye is excited. It is estimated that by the photo acid generator in an excited state, Si—N linkages in the polysilazane are cleaved, and the cleaved Si—N linkages react with water to form silanol (Si—OH) linkages. Because the silanol is soluble in a developing solution described later, and thus only the irradiated portion of the coating film of the radiation sensitive composition is dissolved and removed to achieve positive type patterning.

Specifically, the photo acid generator used in this positive working radiation sensitive polysilazane composition includes e.g. peroxides, naphthoquinone diazide sulfonate, nitrobenzyl ester, etc. Further, benzoin tosylate is also useful. Other useful photo acid generators include nitrobenzyl sulfonic acids, onium salts [for example, bis(4-t-butylphenyl)iodonium salt and triphenyl sulfonium salt], etc. If necessary, two or more of these photo acid generators can be used in combination.

Hereinafter, the photo acid generators of peroxide type, naphthoquinone diazide sulfonate type and nitrobenzyl ester type are enumerated. However, the following examples are listed for merely illustrative purposes, and the photo acid generator used in this invention is not limited to those enumerated below.

Peroxide Type Photo Acid Generator 3,3',4,4'-tetra(t-butylperoxycarbonyl)benzophenone, t-butylperoxy benzoate, methyl ethyl ketone peroxide, cyclohexanone peroxide, methylcyclohexanone peroxide, methyl acetoacetate peroxide, acetyl acetone peroxide, 1,1-bis(t-hexylperoxy)3,3,5-trimethyl cyclohexane, 1,1-bis(t-hexylperoxy)cyclohexane, 1,1-bis(t-butylperoxy)3,3,5-trimethyl cyclohexane, di-t-butylperoxy-2-methyl cyclohexane, 1,1-bis(t-butylperoxy)cyclohexane, 1,1-bis(t-butylperoxy)-cyclododecane, 2,2-bis(t-butylperoxy)butane, n-butyl 4,4-bis(t-butylperoxy)valerate, 2,2-bis(4,4-di-t-butylperoxycyclohexyl)propane, p-menthanehydroperoxide, diisopropylbenzene hydroperoxide, 1,1,3,3-tetramethyl butyl hydropentyl peroxide, cumene hydroperoxide, t-hexyl hydroperoxide, t-butylhydroperoxide, α,α'-bis(t-butylperoxy) diisopropylbenzene, dicumyl peroxide, 2,5-dimethyl-2,5-bis(t-butylperoxy)hexane, t-butylcumyl peroxide, di-t-butyl peroxide, 2,5-dimethyl-2,5-bis(t-butylperoxy)hexyne-3, isobutyryl peroxide, 3,5,5-trimethyl hexanoyl peroxide, octanoyl peroxide, lauroyl peroxide, stearoyl peroxide, succinic acid peroxide, m-toloyl benzoyl peroxide, benzoyl peroxide, di-n-propyl peroxydicarbonate, diisopropyl peroxydicarbonate, bis(4-t-butylcyclohexyl) peroxydicarbonate, di-2-ethoxyethyl peroxydicarbonate, di-2-ethylhexyl peroxydicarbonate, di-3-methoxybutyl peroxydicarbonate, di(3-methyl-3-methoxybutyl) peroxydicarbonate, α,α'-bis(neodecanoylperoxy) diisopropyl benzene, cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxyneodecanoate, t-hexyl peroxypivalate, t-butyl peroxypivalate, 1,1,3,3-tetramethylbutylperoxy-2-ethyl hexanoate, 2,5-dimethyl-2,5-bis(2-ethylhexanoylperoxy)hexane, 1-cyclohexyl-1-methylethylperoxy-2-ethyl hexanoate, t-hextylperoxy 2-ethyl hexanoate, t-butylperoxy 2-ethyl hexanoate, t-butylperoxy isobutyrate, t-hexylperoxy isopropyl monocarbonate, t-butylperoxy maleic acid, t-butylperoxy 3,5,5-trimethyl hexanoate, t-butyl peroxylaurate, 2,5-dimethyl-2,5-(m-toloylperoxy)hexane, t-butyl peroxyisopropyl monocarbonate, t-butyl peroxy 2-ethylhexyl monocarbonate, t-hexyl peroxybenzoate, 2,5-dimethyl-2,5-bis(benzoylperoxy)hexane, t-butyl peroxyacetate, t-butylperoxy-m-toloyl benzoate, bis(t-butylperoxy) isophthalate, t-butyl peroxy allyl monocarbonate, t-butyltrimethylsilyl peroxide, 1,3-di(t-butylperoxydicarbonyl)benzene, etc.

Naphthoquinonediazide Sulfonate Type Photo Acid Generator 1,2-naphthoquinone-(2)-diazide-5-sulfonic acid chloride, 1,2-naphthoquinone-(2)-diazide-4-sulfonic acid chloride, (mono to tri)esters between 2,3,4-trihydroxybenzophenone and 6-diazo-5,6-dihydro-5-oxo-naphthalene-1-sulfonic acid, (mono to tri)esters between 2,3,4,4'-trihydroxybenzophenone and 6-diazo-5,6-dihydro-5-oxo-naphthalene-1-sulfonic acid, etc.

Nitrobenzyl Ester Type Photo Acid Generator

Nitrobenzyl tosylate, dinitrobenzyl tosylate, nitrobenzyl chloride, dinitrobenzyl chloride, nitrobenzyl bromide, dinitrobenzyl bromide, nitrobenzyl acetate, dinitrobenzyl acetate, nitrobenzyl trichloroacetate, nitrobenzyl trifluoroacetate, etc.

The content of these photo acid generators in the radiation sensitive polysilazane composition shall be a suitable amount depending on the type of the photo acid generator and the use of the radiation sensitive composition, and the amount of the photo acid generator is generally 0.05 to 50% by weight, preferably 0.1 to 20% by weight, more preferably 1 to 20% by weight relative to the weight of the polysilazane. If the content of the photo acid generator is less than 0.05% by weight, the rate of decomposition reaction is significantly decreased, while if the content is greater than 50% by weight, e.g. the resultant modified poly(sil sesquiazane) may hardly give a characteristic dense film derived from modified poly(sil sesquiazane).

When the radiation sensitive composition comprising the polysilazane, for example the modified poly(sil sesquiazane) and the photo acid generator should be stored over a predetermined time, some photo acid generators, for example nitrobenzyl sulfonate, may be decomposed by a very small amount of $NH_3$ released from the polysilazane in the radiation sensitive composition during storage. In this case, the storage stability of the radiation sensitive composition can be improved by selecting an alkali-resistant photo acid generator. The alkali-resistant photo acid generator includes not only iminosulfonate derivatives, disulfone derivatives and diazomethane derivatives, but also sulfoxime type compounds such as 4-methoxy-α-((((4-methoxyphenyl)sulfonyl)oxy)imino)benzene acetonitrile and triazine type compounds, for example the following compounds.

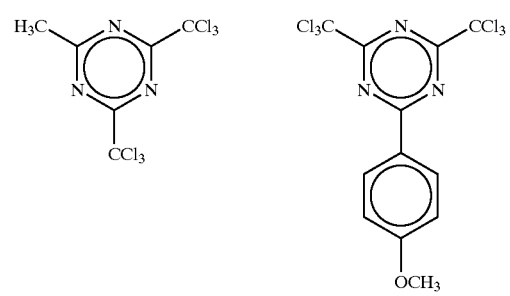

By adding a water-soluble compound as a shape stabilizer to the radiation sensitive polysilazane composition, the resolution can further be improved. This effect is particularly significant when the polysilazane used is the modified poly(sil sesquiazane) shown in (D) above. The shape stabilizer refers to an agent by which the side wall of a pattern section formed by removing an irradiated portion can be made further steep.

As described above, Si—N linkages in the polysilazane are cleaved by irradiation and then react with water in the atmosphere to form silanol linkages. By this reaction, formation of silanol linkages rapidly occurs in the coating film near to the surface in contact with a hydrous atmosphere. However, the polysilazane e.g. the modified poly(sil sesquiazane) shown in (D) above is highly hydrophobic so that the amount of water permeating into the coating film via the surface thereof is decreased at a site nearer to the interface of the substrate coated, and thus formation of silanol linkages hardly occurs in an internal part of the coating film not contacting with the hydrous atmosphere. Accordingly, the sensitivity of the modified poly(sil sesquiazane) coating film is decreased from the surface of the coating film to the interface of the substrate, to bring about a difference in sensitivity therebetween. The present inventors found that this difference in sensitivity causes the following problem.

As shown in FIG. 1, a modified poly(sil sesquiazane) coating film 5 has not only a part irradiated directly with light via an opening of a mask 1 but also a part 4 irradiated indirectly due to irradiation "oozing" into the modified poly(sil sesquiazane) shielded by the mask 1. Now, when the difference in sensitivity described above occurs in the coating film, silanol linkages are formed more easily in a site nearer to the surface of the coating film and thus easily dissolved and removed by subsequent development. As a result, a side wall 3 of the pattern section slopes gently as shown in FIG. 1, and this phenomenon was found to be one factor limiting fine patterning or improvement in resolution.

Figure 2:
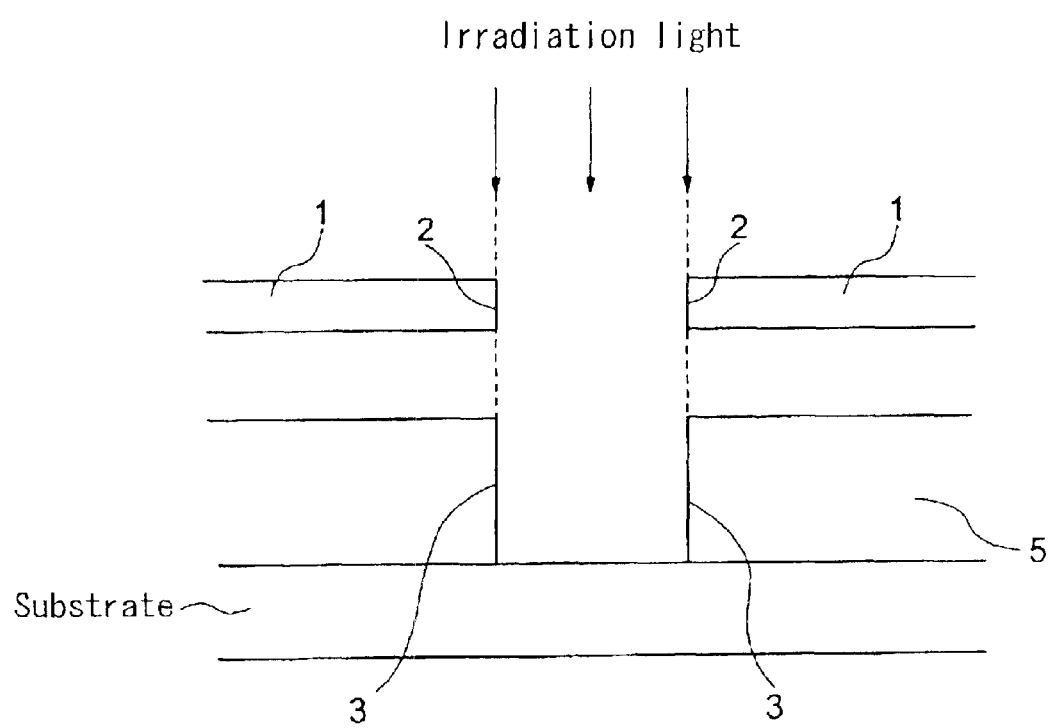
FIG. 2 is a schematic sectional view showing the shape of a side wall of a pattern section of a radiation sensitive polysilazane composition containing a water-soluble compound as shape stabilizer according to the present invention.

The present inventors found that when a water-soluble compound is added as a shape stabilizer, the side wall of a pattern section can be made steep to improve resolution. That is, by adding the water-soluble compound, the hydrophobicity of the radiation sensitive coating film is decreased, thus promoting the access of water from the surface of the coating film in contact with the hydrous atmosphere to the inside of the coating film. Accordingly, the difference in the rate of formation of silanol linkages between the vicinity of the surface of the coating and the vicinity of the interface of the substrate , that is, the difference in sensitivity is decreased. Thus, the irradiation energy necessary for sufficiently dissolving and removing the region ranging from the part of the coating film corresponding to the opening of the mask to the vicinity of the interface of the substrate can be reduced, and in consequence, the energy of "oozing light" into the part shielded by the mask can be reduced. In the part where the energy of "oozing light" is reduced to be too low to cleave Si—N linkages in the modified poly(sil sesquiazane), as silanol linkages are not formed, the part 4 irradiated indirectly with "oozing light" is not dissolved or removed at the time of development. As a result, the range of the coating film dissolved and removed in the part shielded by the mask is reduce, whereby the side wall 3 of the pattern section is made steep, and most preferably the side wall stands upright as shown in FIG. 2.

It can be easily understood that the side wall of the pattern section can be made steep regardless of the sensitivity of the radiation sensitive composition. That is, when the sensitivity of the radiation sensitive composition in the vicinity of the substrate is increased, the side wall of the pattern section is made steep by decreasing the energy of irradiation as described above. When the sensitivity of the radiation sensitive composition is reduced as a whole by adding e.g. the water soluble compound according to this invention, the energy of irradiation necessary for sufficiently dissolving and removing the region ranging from the part of the coating corresponding to the opening of the mask to the vicinity of the interface of the substrate should be increased in some cases, but the energy of "oozing light" necessary for cleaving Si—N linkages in the mask-shielded portion of the modified poly(sil sesquiazane) is also increased. Therefore the side wall of the pattern section is made similarly steep in the case that the difference in sensitivity of the coating is low. In short, regardless of the sensitivity of the radiation sensitive composition, the side wall of the pattern section is made steep by reducing the difference in sensitivity between the vicinity of the surface of the coating and the vicinity of the interface of the substrate.

The water-soluble compound even if insoluble in neutral water is useful insofar as it is soluble in acidic water or alkaline water. This is because when the water-soluble compound is soluble in acidic water, the light-exposed part is made acidic by an acid generated from the photo acid generator, and when it is soluble in alkaline water, the permeability of an developing solution is promoted at the time of development with an aqueous alkaline solution. In either case, the access of water from the surface of the coating to the inside of the coating is promoted, and thus the difference in sensitivity between the vicinity of the surface of the coating and the vicinity of the interface of the substrate is reduced.

The water-soluble compound in this invention may be a single compound or polymer. The solubility of the water-soluble compound may be about at least 0.01 g/100 milliliters in neutral water, acidic water or alkaline water, and it is not always necessary for the water-soluble compound to be readily soluble. As described later, it is preferable that the water-soluble compound is uniformly mixed with the radiation sensitive composition, and thus it should have sufficient compatibility with the polysilazane and the solvent.

Examples of such compounds include 2-nitroaniline, 3-nitroaniline, 4-nitroaniline, 2-nitro-4-aminotoluene, 3-nitro-2-aminotoluene, 3-nitro-4-aminotoluene, 4-nitro-2-aminotoluene, 5-nitro-2-aminotoluene, 6-nitro-2-aminotoluene, 4-nitrobenzene-azo-orcinol, 1-(4-nitrobenzene sulfonyl)-1H-1,2,4-triazole, 5-nitrobenzimidazole, 4-nitrobenzyl acetate, 2-nitrobenzyl alcohol, 3-nitrobenzyl alcohol, 4-nitrobenzyl alcohol, nitrocyclohexane, 1-nitropropane, 2-nitropropane, nifedipin, 2,7-dinitrofluone, 2,7-dinitro-9-fluorenone, 3,3'-dinitrobenzophenone, 3,4'-dinitrobenzophenone, propylene carbonate, ethylene carbonate, amide compounds such as trifluoroacetoamide, trifluoroacetate ammonium salt, water-soluble acrylic polymer, water-soluble epoxy polymer, water-soluble melamine polymer, etc. Particularly preferable water-soluble compounds are 2-nitroaniline, 3-nitroaniline, 4-nitroaniline, 2-nitro-4-aminotoluene, propylene carbonate, ethylene carbonate and water-soluble acrylic polymer.

The water-soluble compound is added as a shape stabilizer in an amount of usually 0.01 to 50% by weight of the polysilazane, for example the modified poly(sil sesquiazane). The optimum mixing ratio is varied depending on the characteristics of the individual water-soluble compounds, but if the content is less than 0.01% by weight, the effect of improving the slope of the pattern wall is not sufficient, while if the content is greater than 50% by weight, there occurs problems such as defects and insufficient strength in the physical properties of the film after development. The amount of the water-soluble compound added is preferably 0.05 to 40% by weight, more preferably 0.1 to 30% by weight relative to the polysilazane.

The radiation sensitive composition is prepared by adding the photo acid generator and the water-soluble compound as the shape stabilizer to the polysilazane. The photo acid generator and the water-soluble compound are preferably uniformly mixed, and for this mixing, it is preferable that the polysilazane, the photo acid generator and the water-soluble compound are mixed under vigorous stirring, or the respective components are mixed after dissolved in a solvent described later. In particular, when the photo acid generator and the water-soluble compound are solid, it is preferable that the components are once dissolved in the solvent and then mixed.

When these components are added, the temperature and pressure are not particularly limited, and they can be added at room temperature and atmospheric pressure. However, the procedures from the addition step to the development step described later are conducted desirably in environments not containing light having the radiation sensitive wavelength of the photo acid generator used, preferably in a dark place, in order to prevent excitation of the photo acid generator.

The radiation sensitive polysilazane composition comprising the polysilazane and the photo acid generator used in this invention may contain a sensitizing dye if necessary. For example, there is a photo acid generator such as 3,3', 4,4'-tetra(t-butylperoxycarbonyl)benzophenone, which is excited at a wavelength shorter than about 330 nm. When the photo acid generator whose radiation sensitive range is in such a short-wavelength range is irradiated with light by an excimer laser such as KrF type (248 nm), ArF type (193 nm), etc., the photo acid generator is directly excited by the irradiation, thus making it unnecessary to use a sensitizing dye. However, when an inexpensive light source such as a high-pressure mercury lamp (360 to 430 nm) is used, the photo acid generator can be excited indirectly by combining it with a sensitizing dye to be excited in the corresponding wavelength range, and the exposure can be conducted using an inexpensive light source such as a high-pressure mercury lamp (360 to 430 nm). The sensitizing dye includes coumarin, ketocoumarin and derivatives thereof, pyrylium salts, thiopyrylium salts, and dyes such as cyanine dyes, carbocyanine dyes and styryl dyes. These sensitizing dyes are used in an amount of usually 0.05 to 50% by weight, preferably 1 to 20% by weight relative to the polysilazane.

Specifically, the sensitizing dye used in the radiation sensitive polysilazane composition includes p-bis(o-methylstyryl)benzene, 7-dimethylamino-4-methylquinolon-2, 7-amino-4-methylcoumarin, 4,6-dimethyl-7-ethylaminocoumarin, 2-(p-dimethylaminostyryl)-pyridyl methyl iodide, 7-diethylaminocoumarin, 7-diethylamino-4-methylcoumarin, 2,3,5,6-1H,4H-tetrahydro-8-methylquinolidino-<9,9a,1-gh>coumarin, 7-diethylamino-4-trifluoromethylcoumarin, 7-dimethylamino-4-trifluoromethylcoumarin, 7-amino-4-trifluoromethyl-coumarin, 2,3,5,6-1H,4H-tetrahydroquinolidino-<9,9a,1-gh>coumarin, 7-ethylamino-6-methyl-4-trifluoromethyl-coumarin, 7-ethylamino-4-trifluoromethylcoumarin, 2,3,5,6-1H,4H-tetrahydro-9-carboethoxy-quinolidino-<9,9a,1-gh>coumarin, 3-(2'-N-methylbenzimidazolyl)-7-N,N-diethylaminocoumarin, N-methyl-4-trifluoromethyl-pyperidino-<3,2-g>coumarin, 2-(p-dimethylaminostyryl)-benzo-thiazolyl ethyl iodide, 3-(2'-benzimidazolyl)-7-N,N-diethylamino coumarin, and 3-(2'-benzothiazolyl)-7-N,N-diethylaminocoumarin, as well as pyrylium salts and thiopyrylium salts represented by the following formula:

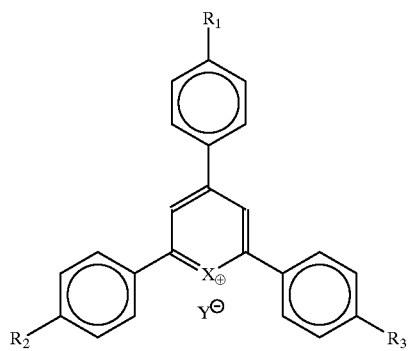

| X | $R_1$ | $R_2$ | $R_3$ | Y |
|---|---|---|---|---|
| S | $OC_4H_9$ | H | H | $BF_4$ |
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

Other examples of the sensitizing dye include the following compounds:

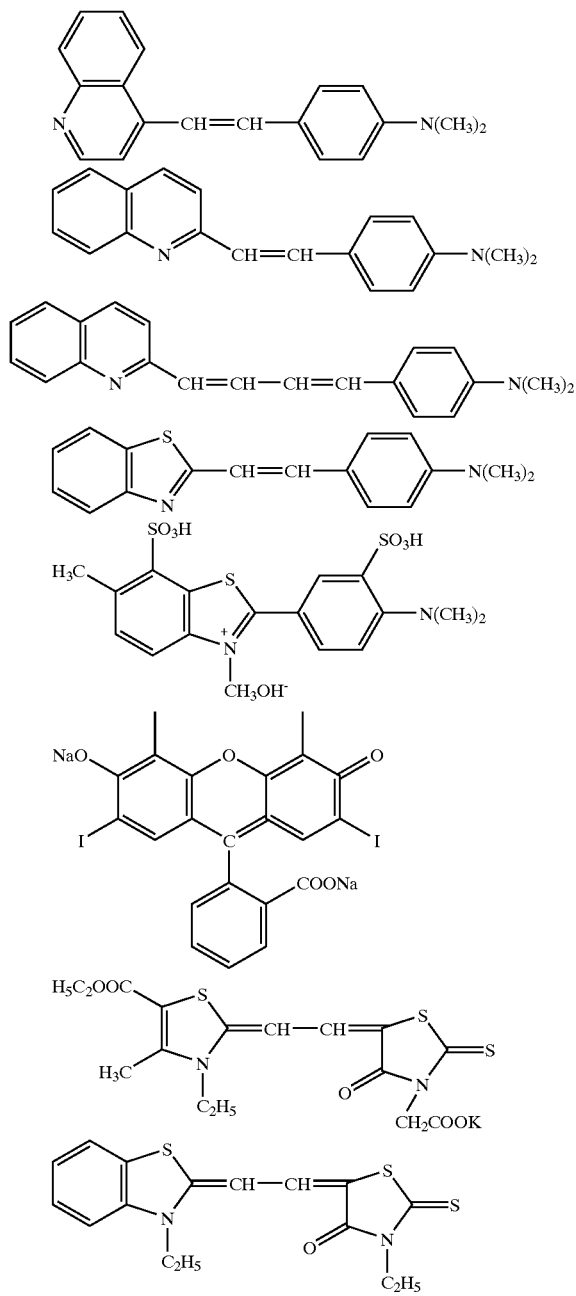

Particularly preferable sensitizing dyes are 7-diethylamino-4-methyl coumarin and 7-diethylamino-4-trifluoromethyl coumarin.

When the sensitizing dye is used, the resultant coating may be colored. When the coating is used as a resist such as an etching resist, the resist is removed after desired patterning processing is finished, and thus coloration of the resist is hardly problematic. However, when the patterned coating is burned and used without removing the coating after patterning, for example when the burned coating is used as an inter-layer dielectric in a display, there are some cases where the burned coating should be transparent to visible rays. In these cases too, the coloration is hardly problematic because when the coating is burned, the sensitizing dye is generally decomposed by the photo acid generator contained in the radiation sensitive polysilazane composition, to make the coating transparent. However depending on the intended use, there are some cases where the coating should be further transparent and colorless. In these cases, an oxidization catalyst capable of decomposing the sensitizing dye during burning of the coating but not participating in the photo-reaction may be added separately to the radiation sensitive polysilazane composition. Examples of such oxidization catalysts include organic metallic compounds and fine particles such as palladium propionate, palladium acetate, acetyl acetonate platinum, ethyl acetonate platinum, fine palladium particles, and fine platinum particles. When the oxidization catalyst is added, the amount of the oxidization catalyst is generally 0.05 to 10% by weight, preferably 0.1 to 5% by weight relative to the polysilazane. By adding the oxidization catalyst, the unnecessary dye can be decomposed and discolored, and simultaneously conversion of the polysilazane into ceramics can be promoted.

By adding a pigment to the radiation sensitive polysilazane composition, a color filter or black matrix superior in heat resistance, insulating properties and hardness and excellent in accuracy of pattern can be obtained. Examples of pigments that can be added to the polysilazane composition include graphite, carbon black, titanium black, ironoxide, copperchromium black, copperiron manganese black, cobalt iron chromium black, etc. The amount of the pigment added is generally 0.05 to 1000% by weight, preferably 10 to 500% by weight relative to the polysilazane.

To improve the efficiency of development, a compound known as the so-called dissolution inhibitor in this technical field can be added to the radiation sensitive polysilazane composition. The general dissolution inhibitor can, owing to its hydrophobicity, prevent the polymer in the unexposed portion of the coating film from being dissolved in an alkali developing solution, while in the light-exposed portion, the dissolution inhibitor itself is rendered hydrophilic by degradation by exposure to light or by the photo acid generator, thus promoting the decomposition of the polymer. As described above, the polysilazane is not dissolved in the developing solution, and thus the advantage of the ability of the dissolution inhibitor to prevent dissolution of the unexposed portion is hardly enjoyed, but the ability thereof to promote dissolution of the exposed portion was found to act advantageously. That is, the rate of dissolution of the light-exposed portion is increased by adding the so-called dissolution inhibitor to the radiation sensitive polysilazane composition, and in consequence, the efficiency of development can be improved. Examples of such dissolution inhibitors include t-butoxycarbonyl (hereinafter refer to as "t-BOC") catechol, t-BOC hydroquinone, t-butyl ester of benzophenone-4,4'-dicarboxylic acid, t-butyl ester of 4,4'-oxydibenzic acid, etc. The dissolution inhibitor can be added in the range of 0.1 to 40% by weight, preferably 1 to 30% by weight relative to the radiation sensitive composition.

When a solvent is used in the radiation sensitive polysilazane composition, it is preferable to use as a solvent, for example, aromatic compounds such as benzene, toluene, xylene, ethylbenzene, diethylbenzene, trimethylbenzene and triethylbenzene; cyclohexane; cyclohexene; decahydronaphthalene; dipentene; saturated hydrocarbon compounds such as n-pentane, i-pentane, n-hexane, i-hexane, n-heptane, i-heptane, n-octane, i-octane, n-nonane, i-nonane, n-decane and i-decane; ethylcyclohexane; methylcyclohexane; p-menthane; ethers such as dipropyl ether and dibutyl ether; ketones such as methyl isobutyl ketone (MIBK); esters such as butyl acetate, cyclohexyl acetate, butyl stearate and ethyl lactate; ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; and propylene glycol monoalkyl ether acetates such as propylene glycol monomethyl ether acetate (PGMEA) and propylene glycol monoethyl ether acetate. When these solvents are used, two or more solvents may be mixed in order to regulate the solubility of the polysilazane or the rate of evaporation of the solvents.

The amount (proportion) of the solvent used is determined in consideration of easiness in operation in the coating method used, the solubility of each component in the radiation sensitive composition, the coating property of the radiation sensitive composition and the thickness of the coating film. The solubility is also varied depending on the average molecular weight, the distribution of molecular weights, and the structure of the polysilazane used. The solvent is used desirably in an amount such as the concentration of polysilazane being made usually 0.1 to 50% by weight, more preferably 0.1 to 40% by weight in consideration of the stability, production efficiency, coating property and so on of the polysilazane.

The radiation sensitive composition of this invention can contain suitable fillers and/or extenders if necessary. Examples of the fillers include fine powders of oxide type inorganic materials such as silica, alumina, zirconia and mica or non-oxide type inorganic materials such as silicon carbide, silicon nitride, etc. Depending on the intended use, metallic powders such as aluminum, zinc, copper, etc. can also be added. As these fillers, there may be used ones having various forms such as needle (including whiskers), granular and scale forms singly or as a mixture of two or more kinds thereof. Further, the particle size of these fillers is desirably smaller than the thickness of the coating film which can be applied once. The amount of the fillers added is in the range of 0.05 to 10 parts by weight, particularly preferably in the range of 0.2 to 3 parts by weight per part by weight of the polysilazane.

The radiation sensitive composition of this invention may further contain a leveling agent, a deforming agent, an antistatic agent, a Lw absorber, apH adjuster, adispersant, asurfacemodifier, a plasticizer, a drying promoter, and an anti-sagging agent if necessary.

The radiation sensitive polysilazane composition is applied onto an arbitrary substrate such as silicon substrate, glass substrate, etc. by a known coating method such as roll coating, dip coating, bar coating, spin coating, spray coating, flow coating and brushing, to form a coating film thereon. A printing method may be used in place of the coating method. In this invention, the coating film encompasses a film formed by a printing method. If necessary, the coating is dried and pre-baked (heat-treated) in order to decrease the amount of gas to be removed. Pre-baking can be conducted at a temperature of 40 to 200° C., preferably 60 to 120° C., for 10 to 180 seconds, preferably 30 to 90 seconds on a hot plate or for 1 to 30 minutes, preferably 5 to 15 minutes in a clean oven. If necessary, the radiation sensitive composition may be applied repeatedly until the desired thickness coating is obtained. The desired thickness is for example 0.05 to 2 $\mu$m for photoresist, 0.5 to 4 $\mu$m for an inter-layer dielectric, or 0.3 to 3 $\mu$m for color filter or black matrix.

The coating film formed from the radiation sensitive polysilazane composition is then exposed with light. In this exposure step, a light source such as high-pressure mercury lamp, low-pressure mercury lamp, metal halide lamp, xenon lamp, excimer laser, X-rays, electron rays, etc. can be used depending on the radiation sensitive range of the radiation sensitive polysilazane composition. Patternwise light irradiation is conducted usually using a photo mask. Except for ultra-fine processing such as semiconductor processing, there is used a light having wavelength of 360 to 430 nm (light from high-pressure mercury lamp) generally as the irradiation light. Particularly, a light of 430 nm in wavelength is often used for a liquid crystal display. In these cases, a combination of the radiation sensitive composition of this invention and the sensitizing dye can be advantageously used as described above.

The amount of light energy irradiated in exposure is varied depending on the light source used and the thickness of the coating, but is usually 0.05 mJ/cm$^2$ or more, desirably 0.1 mJ/cm$^2$ or more. There is no particular upper limit, but it is not practical that a dose of irradiation is set in too high levels because of possibility of halation and from the relationship with the treatment time. It is usually preferable that the amount of light energy irradiated is not greater than 1000 mJ/cm$^2$. Exposure may be conducted generally in the ambient atmosphere (in the air) or in a nitrogen atmosphere, but an atmosphere enriched in oxygen may also be used in order to promote decomposition of the polysilazane.

By exposure of the radiation sensitive polysilazane composition containing the photo acid generator, an acid is generated in the light-exposed portion, whereby Si—N linkages in the polysilazane are cleaved and react with moisture in the ambient atmosphere. In consequence silanol (Si—OH) linkages are formed and the polysilazane is decomposed. It is particularly desirable that the radiation sensitive polysilazane exposed is subjected to moistening treatment. When water is fed continuously to the film by this moistening treatment, the acid once contributed to cleavage of Si—N linkages acts repeatedly as a cleaving catalyst to promote conversion into SiOH. Accordingly, as the humidity of the gas to be contacted with the radiation sensitive polysilazane composition is increased, the rate of decomposition of the polysilazane is also increased. But when the humidity of the gas is too high, there is a danger of condensation of the moisture in the gas on the surface of the film formed from the radiation sensitive polysilazane composition. If moisture condensation occurs, there are instances where decomposition of the polysilazane proceeds in only a surface area of the film. The reason is estimated as condensed water can move only as an apparently large molecule due to hydrogen bonding. Further there are instances where a part of the light-exposed region cannot be removed by development with an aqueous alkaline solution, that is, development residues may also occur. The reason is estimated as the rate of decomposition of the portion to which condensed water adheres is decreased. Accordingly, the humidity of the gas should be regulated in such a range that moisture condensation does not occur on the surface of the coating film. The humidity of the gas expressed in terms of relative humidity to the temperature of the substrate is 35% RH or more, preferably 40% RH or more and more preferably 50% RH or more. There is no particular upper limit of the relative humidity, but moisture condensation may occur at too high humidity as described above, and from this viewpoint, a gas with a relative humidity of 90% RH or less can be practically used.

In this step of moistening the polysilazane, a gas containing water vapor is contacted with the film on the substrate. For bringing the light-exposed film of the radiation sensitive polysilazane composition into contact with the gas containing water vapor, the substrate having the light-exposed film of the radiation sensitive polysilazane composition is usually placed in a moistening treatment apparatus, and a gas containing water vapor may be introduced continuously to this treatment apparatus. If necessary, the humidity of the gas to be introduced may be increased by increasing the moisture in the gas to be contacted with the coating film. If the capacity of the treatment apparatus is large and the apparatus contains water in an amount enough to decompose the coating film, the gas containing water vapor may not be continuously supplied to the treatment apparatus, and only water vapor may be supplied to the treatment apparatus instead of the gas containing water vapor. From the viewpoint of prevention of moisture condensation, it is preferred that the substrate is placed on e.g. a heating plate and heated during the moistening treatment. By heating the substrate, the adhesion between the substrate and the radiation sensitive polysilazane coating film is also improved. The substrate is kept in the aforementioned state for a predetermined time such as preventing an excess of water vapor from contacting with the substrate, and then the substrate is brought out and returned to room temperature.

As the heating temperature of the substrate is increased, moisture condensation hardly occurs on the surface of the coating film. Accordingly, it is preferred that the heating temperature of the substrate is higher because the absolute amount of water vapor contained in the gas can be set at higher levels. The heating temperature is made at room temperature or more, desirably 30° C. or more, but attention should be paid at a temperature of 100° C. or more because the partial pressure of water vapor cannot be increased without using a pressuring heating humidifier. Further, at too high temperatures, SiOH formed by moistening may be converted into SiOSi insoluble in an aqueous alkaline solution. Accordingly, the upper limit of practical temperature is about 100° C. The moistening treatment has been described in detail by reference to a mode wherein the substrate is placed in the treatment apparatus, but can naturally be conducted in the air without using the treatment apparatus. Heating of the substrate may be conducted in an arbitrary manner, for example by heating it on a heating plate as described above or by previously heating a gas to be used in the moistening treatment and then introducing the gas into the moistening treatment apparatus.

After the step of promoting decomposition of the polysilazane, the film of the radiation sensitive polysilazane composition is developed with an alkali developing solution by a known development method such as paddle development, dip development and shower development. By this development, the light-exposed portion of the film of the radiation sensitive polysilazane composition is removed while the unexposed portion remains on the substrate to form a positive pattern thereon. Since the unexposed portion of the polysilazane film is not swollen by the alkali developing solution, the pattern of the irradiation light coincides almost completely with the pattern of the polysilazane decomposed and removed, thus achieving excellent pattern accuracy.

The alkali developing solution includes e.g. an aqueous solution of tetramethyl ammonium hydroxide (TMAH), choline, sodium silicate, sodium hydroxide, potassium hydroxide or the like. The concentration of the alkali may be determined in consideration of various conditions such as the material to be developed, the rate of development required, resolution, etc., but the alkali developing solution used as the standard in the industry, that is, about 2% aqueous TMAH, is conveniently used. When the polysilazane film is used as an etching pattern for semiconductor devices or as an inter-layer dielectric after conversion into silica type ceramics, an aqueous alkali solution free from metal ions is preferably used as the developing solution. The time necessary for development is varied depending on the thickness of the film and the developing solution used, but is generally 0.1 to 5 minutes, preferably 0.5 to 3 minutes. The temperature for development treatment is generally 20 to 50° C., preferably 20 to 30° C.

After development, the patterned polysilazane film is rinsed with pure water as necessary, dried and used directly as an etching mask, or rinsed with pure water and left for a long time e.g. 1 day or more or subjected to burning thereby being converted into a silica type ceramic film usable as e.g. an inter-layer dielectric. The burning temperature and burning time are varied depending on the constitution of the radiation sensitive polysilazane composition, the thickness of the coating film and the heat resistance of the substrate, electronic parts, etc. But the burning temperature is usually 50 to 1000° C., preferably 100 to 1000° C., more preferably 150 to 450° C. The burning time is generally 5 minutes or more, preferably 10 minutes or more. The burning atmosphere may be generally the ambient atmosphere (in the air), but an atmosphere with a higher content of oxygen and/or a higher partial pressure of water vapor may also be used in order to promote oxidation of the polysilazane.

In the pretreatment step for burning this polysilazane film, the patterned polysilazane film is subjected to exposure and moistening treatment, whereby a silica type ceramic film with a low dielectric constant excellent in heat resistance, abrasion resistance, corrosion resistance, insulating properties and transparency and suitable as e.g. an inter-layer dielectric can be easily formed. That is, as the radiation sensitive polysilazane composition comprising the polysilazane and the photo acid generator is a positive working composition, the radiation sensitive polysilazane coating film remaining as a pattern contains the photo acid generator in the initial amount. Accordingly, when exposure and moistening treatment of the radiation sensitive polysilazane coating film are conducted in the pretreatment step for burning, an acid is formed in the coating film in the same mechanism as in patterning of the radiation sensitive polysilazane coating film as described above, and by the catalytic action of this acid, Si—N linkages in the polysilazane are cleaved, and the conversion thereof into Si—OH is promoted by the moistening treatment. The polysilazane film thus converted into Si—OH is easily converted by burning into SiOSi to give a silica type ceramic film having no or few SiNH linkages in the film after burning.

Exposure as the pretreatment step for burning of the radiation sensitive polysilazane coating film may be conducted in an analogous manner to pattern exposure of the radiation sensitive polysilazane coating film. That is, as a light source used for exposure, any one such as a high-pressure mercury lamp, low-pressure mercury lamp, metal halide lamp, xenon lamp, excimer laser, X-rays, electron rays or the like can be used depending on the radiation sensitive range of the radiation sensitive polysilazane composition. In exposure in the pretreatment step for burning, it is preferable that the substrate is wholly exposed once to light, but if necessary, only the patterned portion or a part of the substrate may be exposed to light once or several times. The intensity of light exposed is varied depending on the light source, the thickness of the film, and the sensitivity of the radiation sensitive composition used, but it is usually 0.05 mJ/cm$^2$ or more, desirably 0.1 mJ/cm$^2$ or more. There is no particular upper limit of the intensity, but 10000 mJ/cm$^2$ or less is practical. The atmosphere in exposure may be the ambient atmosphere (in the air) or a nitrogen atmosphere as is the case with exposure for patterning, but an atmosphere enriched in oxygen may also be used in order to promote decomposition of the polysilazane.

Further, the moistening treatment as the pretreatment step for burning may be also conducted by bringing the light-exposed radiation sensitive polysilazane film into contact with a water vapor-containing gas in the same manner as in the moistening treatment after patternwise exposure of the radiation polysilazane film. In the moistening treatment as the pretreatment step for burning of the radiation sensitive polysilazane film of this invention, when the moistening treatment of the radiation sensitive polysilazane film in exposure in the pretreatment for burning is conducted by moisture in the atmosphere, the moistening treatment at the time of exposure can also serve as the moistening treatment in the pretreatment step for burning. From the viewpoint of shortening the treatment time, however, the moistening treatment of the film is conducted preferably with a highly humid gas containing a larger amount of water than in the gas used in exposure. When the film is subjected to moistening treatment in a heated state, conversion of the polysilazane into SiOH is promoted as same as the case of the moistening treatment of the radiation sensitive polysilazane film after subjected to patternwise exposure. Accordingly, the method of moistening treatment is preferably a method wherein the substrate having the light-exposed radiation sensitive polysilazane film is placed on a heating plate, and the substrate is contacted in a heated state with a highly humid gas.

The burning temperature, burning time and burning atmosphere for the radiation sensitive polysilazane coating film after subjected to moistening treatment maybe a range or conditions similar to those of the film not subjected to moistening treatment.

This invention has been described in detail by reference to a mode wherein a patterned coating film of the radiation sensitive polysilazane is formed and then this patterned coating film of the radiation sensitive polysilazane is burned. But the coating film of the radiation sensitive polysilazane may be burned directly without subjecting it to patterning, thus permitting the whole area of the coating film to be converted to silica type ceramic film. In this case too, the conditions of exposure and moistening treatment as the pretreatment step for burning may be similar to those for burning the patterned coating film of the radiation sensitive polysilazane.

By the pretreatment and subsequent burning as described above, a silica type ceramic film characterized by a dielectric constant of 5 or less, sometimes a dielectric constant of 3.3 or less and a resistivity of at least $10^{13}$ Ω·cm can be obtained.

EXAMPLES

Hereinafter, this invention is described in more detail by reference to the Examples, which however are not intended to limit the scope of this invention.

Reference Example

Preparation of Modified Poly(Sil Sesquiazane)

A gas inlet, a mechanical stirrer, a Dewar condenser were attached to a four-necked flask. The atmosphere in the reaction flask was replaced by deoxygenated dry nitrogen. Starting materials CH$_3$SiCl$_3$ and (CH$_3$)$_2$SiCl$_2$ and/or (CH$_3$)$_3$SiCl (about 50 g in total) were charged into the flask in a predetermined molar ratio, and mixed. Then, degassed dry pyridine was introduced thereto such that the concentration of the starting materials was reduced to about 10% by weight, and the mixture was cooled on ice. While the mixture of the starting materials was stirred, a mixture of ammonia ($NH_3$) and a nitrogen gas was introduced to it until the reaction was completed After the reaction was completed, the solid product was separated by centrifugation and then removed by filtration. By removing the solvent under reduced pressure from the filtrate, a modified poly(sil sesquiazane) was obtained.

Figure 3:
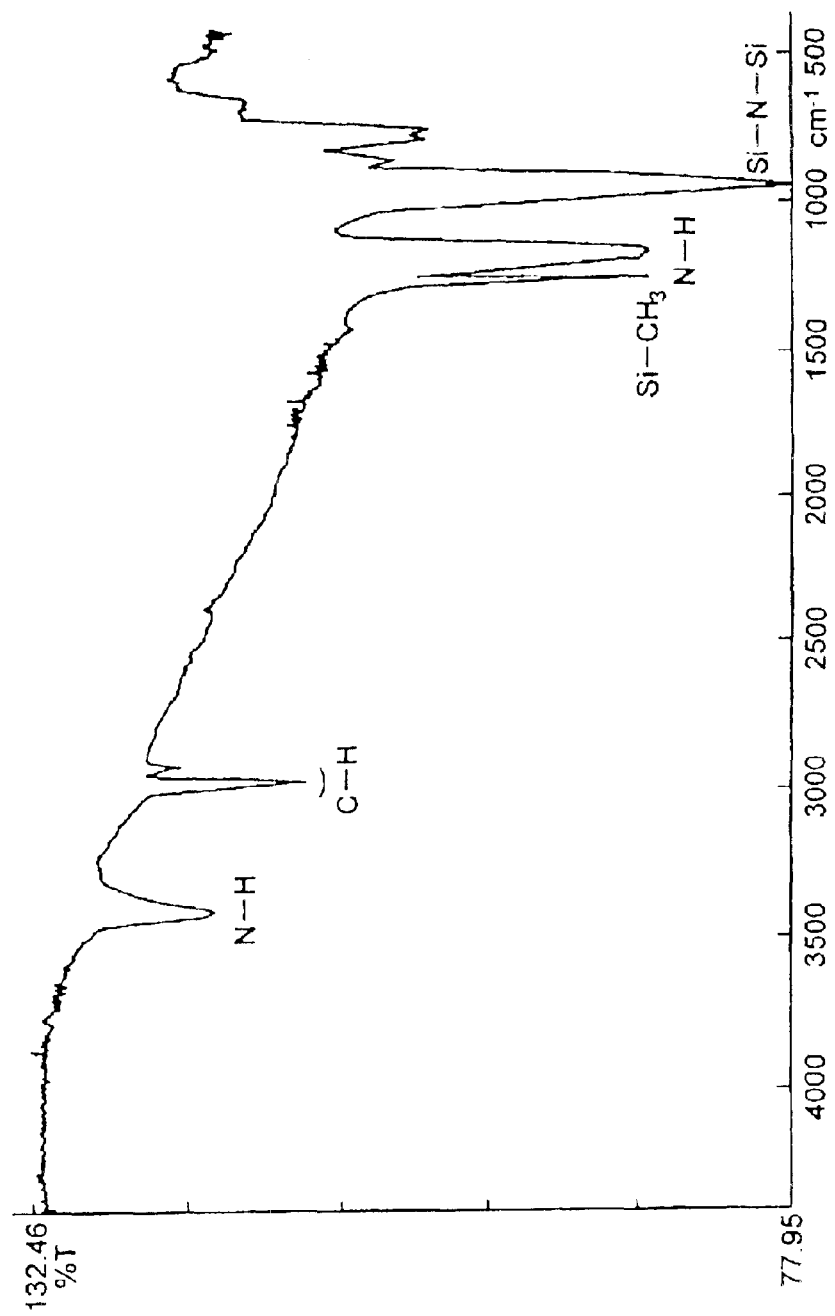
FIG. 3 is an IR absorption spectrum of the modified poly(sil sesquiazane) used in the radiation sensitive composition of the present invention.

The ratio of the constituent unit —[Si($CH_3$)$_2$NH]— to the constituent unit —[Si($CH_3$)$_3$(NH)$_{0.5}$]— in the modified poly(sil sesquiazane) can be determined by its Si-NMR spectrum. Further, the constitution of the modified poly(sil sesquiazane) can be roughly known by characteristic peaks attributable to various bonds in its infrared (IR) absorption spectrum. For example, an IR spectrum of the modified poly(sil sesquiazane) containing 20 mol-% of —[Si($CH_3$)$_2$NH]— as the other constituent unit is shown in FIG. 3. From these measurement results, it was confirmed that the ratio of the various constituent units in the modified poly(sil sesquiazane) almost reflects the molar ratio of the corresponding starting materials.

Example 1 and Comparative Example 1

According to the procedure described in the Reference Example, a modified poly(sil sesquiazane) containing —[SiCH$_3$(NH)$_{1.5}$]— as the basic constituent unit and about 10 mol-% of —[Si($CH_3$)$_2$NH]— was prepared. To this modified poly(sil sesquiazane), a sulfoxime derivative [4-methoxy-α-((((4-methoxyphenyl)sulfonyl)oxy)imino) benzene acetonitrile] represented by the formula (1) below was added as a photo acid generator in an amount of 5% by weight relative to the polymer, and a coumarin dye represented by the formula (2) below was added as a sensitizer in an amount of 10% by weight. The whole of the mixture was diluted with xylene such that the polymer concentration was adjusted to 15% by weight.

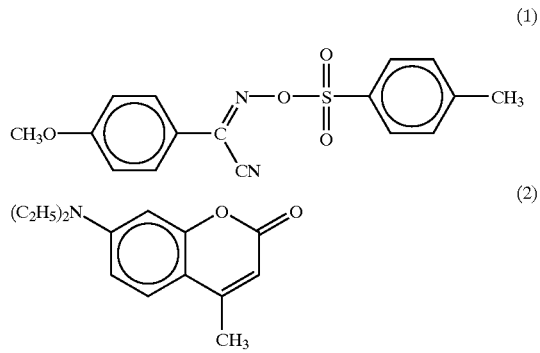

This solution was divided into two solutions, to one of which 2-nitroaniline was added in an amount of 2% by weight relative to the modified poly(sil sesquiazane). The other solution to which 2-nitroaniline was not added was used as Comparative Example 1.

Each solution was spin-coated on a silicon substrate at 2000 rpm (coating thickness: 0.4 μm). This coating film was exposed through a mask having a 0.5 μm isolated pattern with 40 mJ/cm$^2$ irradiation amount by a KrF excimer laser exposure device. Then, the coating film was developed with 2.38 weight-% aqueous TMAH (tetramethylammonium hydroxide).

The resultant silicon substrate having the patterned film thereon was cut, and the cleaved surface was observed in the direction of the section under an electron microscope (SEM) to determine the angle of inclination.

Example 2

The same procedure as in Example 1 was repeated except that in place of 2-nitroaniline, 2-nitropropane was added in an amount of 1% by weight relative to the modified poly(sil sesquiazane).

Example 3

The same procedure as in Example 1 was repeated except that in place of 2-nitroaniline, propylene carbonate was added in an amount of 5% by weight relative to the modified poly(sil sesquiazane).

Example 4

The same procedure as in Example 1 was repeated except that in place of 2-nitroaniline, a water-soluble acrylic polymer (acrylic polymer "Alon A-20P" (trade name) produced by Toagosei Chemical Industry Co., Ltd.) was added in an amount of 10% by weight relative to the modified poly(sil sesquiazane).

[Comparison of the Angles of Inclination]

The inclination angles of the patterned films obtained in Examples 1 to 4 and Comparative Example 1 are as follows:

| Example | Angle of inclination (degrees) |
| --- | --- |
| Example 1 | 90 |
| Example 2 | 90 |
| Example 3 | 90 |
| Example 4 | 90 |
| Comparative Example 1 | 70 |

[Comparison of the Characteristics of the Burned Films]

Then, the pattern films obtained in Examples 1 to 4 and Comparative Example 1 were burned under the following conditions. The burned films were measured in the following manner for their dielectric constant and film hardness and evaluated for their usefulness as inter-layer dielectric.

Burning Conditions

Each patterned film was pre-heated on a hot plate at 150° C. for 1 minute and then placed in a burning oven at 400° C. for 30 minutes.

Method of Measuring Dielectric Constant

An aluminum specimen having an area of 1 mm$^2$ was formed on an upper part of the burned film, to prepare an upper electrode. An alloy layer was formed on the silicon substrate to form a lower electrode, and a MOS capacitor was constituted as a whole. Capacitance of the MOS capacitor (C-V character) was measured with an HP4192A impedance analyzer (made by Hewlett-Packard Co.) by applying bias voltage across the capacitor, and from this character, the dielectric constant was calculated.

Measurement of Hardness

Film hardness of burned films was measured by Nano Indenter XP produced by MTS Systems Co.

Comparison of Characteristics

The measurement results are as follows:

| Example | Dielectric Constant | Hardness (GPa) |
| --- | --- | --- |
| Example 1 | to 2.6 | 1.0 |
| Example 2 | to 2.6 | 1.0 |
| Example 3 | to 2.6 | 1.0 |
| Example 4 | to 2.2 | 0.7 |
| Comparative Example 1 | to 2.6 | 1.0 |

The results of dielectric constant and hardness indicate that the burned films obtained according to this invention have useful characteristics as an inter-layer dielectric.

Example 5

According to the procedure described in the Reference Example, a modified poly(sil sesquiazane) comprising —[SiCH$_3$(NH)$_{1.5}$]— as a basic constituent unit and 5mol-% —[Si(CH$_3$)$_3$(NH)$_{0.5}$]— was prepared. To this modified poly(sil sesquiazane), a triazine derivative represented by the formula:

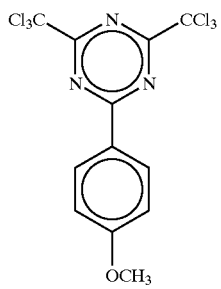

was added as a photo acid generator in an amount of 1% by weight, and this mixture was diluted with propylene glycol monomethyl ether acetate (PGMEA) such that the total solid content was adjusted to 10% by weight, to prepare a radiation sensitive polysilazane composition. This radiation sensitive polysilazane composition was spin-coated at 1000 rpm onto a silicon substrate, and then pre-baked at 90° C. for 90 seconds to form a coating film of 0.4 μm in thickness. The substrate having this coating film of the radiation sensitive polysilazane composition was exposed through a mask having 1:1 line and space patterns having various line widths to varying variation in a step of 15 mJ/cm² from 10 mJ/cm² to 1000 mJ/cm² by a KrF excimer laser exposure device. Then, the coating film was subjected to moistening treatment at 25° C. at 60% RH for 5 minutes, and the substrate was developed with 2.38 weight-% aqueous TMAH for 1 minute, and then the substrate was rinsed with pure water. The resultant pattern was observed under SEM. The amount of irradiation by which the exposed part of the coating film could be completely removed was defined as sensitivity, and the results shown in Table 1 were obtained.

Comparative Example 2

The same procedure as in Example 5 was conducted except that the moistening treatment conditions were those described in Table 1, and the results shown in Table 1 were obtained.

TABLE 1

| | Moistening treatment conditions | | | |
| --- | --- | --- | --- | --- |
| | Temperature (° C.) | Humidity (% RH) | Treatment time (min) | Sensitivity (mJ/cm²) |
| Example 5 | 25 | 60 | 5 | 70 |
| Comparative Example 2 | 25 | 35 | 0 | >1000 |

As can be seen from the results in Table 1 above, the sensitivity of the radiation sensitive polysilazane composition is improved by increasing the humidity in the atmosphere at the time of treatment, whereby the treatment time can be shortened.

Examples 6 to 8

According to the procedure described in the Reference Example, a modified poly(sil sesquiazane) comprising —[SiCH$_3$(NH)$_{1.5}$]— as a basic constituent unit and 10 mol-% of —[Si(CH$_3$)$_2$NH]— was prepared. To this modified poly(sil sesquiazane), a sulfoxime derivative represented by the formula:

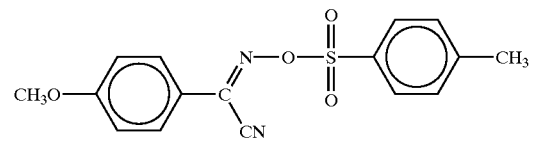

was added as a photo acid generator in an amount of 5% by weight, and a coumarin derivative represented by the formula:

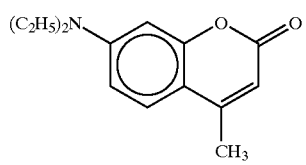

was added as a sensitizer in an amount of 10% by weight. The mixture was diluted with butyl acetate such that the total solid content was reduced to 10% by weight to prepare a radiation sensitive polysilazane composition. This radiation sensitive polysilazane composition was spin-coated at 1000 rpm onto a silicon substrate, and then spin-dried to form a coating film of 0.4 μm in thickness. Then, the substrates were exposed through a mask having 1:1 line and space patterns having various line widths with an irradiation amount of 0.1 mJ/cm² step from 0.1 mJ/cm² to 1 mJ/cm², an irradiation amount of 1 mJ/cm² step from 1 mJ/cm² to 10 mJ/cm², an irradiation amount of 10 mJ/cm² step from 10 mJ/cm² to 100 mJ/cm², and an irradiation amount of 100 mJ/cm² step from 100 mJ/cm² to 1000 mJ/cm² by an i-ray exposure device respectively. The exposed substrate was placed on a heating plate in a moistening treatment apparatus, and then treated under the moistening treatment conditions described in Table 2, developed and rinsed in the same manner as in Example 5, to give the sensitivity shown in Table 2.

Comparative Example 3

The same procedure as in Example 6 was conducted except that the moistening treatment conditions were shown in Table 2, and the results shown in Table 2 were obtained.

TABLE 2

| | Moistening treatment conditions | | | |
|---|---|---|---|---|
| | Temperature (° C.) | Humidity (% RH) | Treatment time (min) | Sensitivity (mJ/cm$^2$) |
| Example 6 | 25 | 60 | 5 | 70 |
| Example 7 | 50 | 50 | 3 | 10 |
| Example 8 | 90 | 50 | 1 | 0.2 |
| Comparative Example 3 | 25 | 35 | 0 | >1000 |

As can be seen from the results shown in Tables 1 and 2, the treatment time can be reduced by heating the substrate during the treatment. Further even if the treatment is conducted at the same humidity, the sensitivity is improved by the moistening treatment under heating conditions, whereby the treatment time can be further reduced.

Examples 9 to 11

According to the procedure described in the Reference Example, a modified poly(sil sesquiazane) comprising —[SiCH$_3$(NH)$_{1.5}$]— as a basic constituent unit and 10 mol-% of —[Si(Ph)$_2$NH]— (Ph: phenyl group) was prepared. To this modified poly(sil sesquiazane), a peroxide represented by the formula:

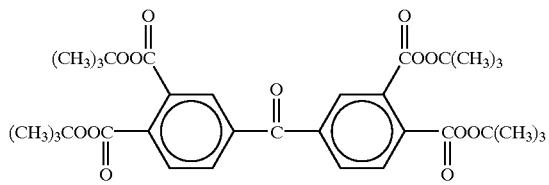

was added as a photo acid generator in an amount of 1% by weight. This mixture was diluted with PGMEA such that the total solid content was reduced to 30% by weight, to prepare a radiation sensitive polysilazane composition. This radiation sensitive polysilazane composition was spin-coated at 3000 rpm onto a silicon substrate, and then pre-baked at 60° C. for 60 seconds to form a coating film of 0.8 μm in thickness. The substrate having this coating film of the radiation sensitive polysilazane composition was printed by exposing it to an irradiation amount of 80 μC/cm$^2$ by an electron ray exposure device as the exposure device through a mask having 1:1 line and space patterns having various line widths. Then, the substrate was treated under the moistening treatment conditions shown in Table 3, and then developed for 1 minute with 2.38 weight-% aqueous TMAH, and then the substrate was rinsed with pure water, and the resultant pattern was observed under SEM, to confirm the destruction of the pattern. The line width of the minimum pattern that was not destructed is shown in Table 3.

TABLE 3

| | Moistening treatment conditions | | | Minimum pattern not destructed (μm) |
|---|---|---|---|---|
| | Temperature (° C.) | Humidity (% RH) | Treatment time (min) | |
| Example 9 | 25 | 50 | 10 | 0.5 |
| Example 10 | 30 | 50 | 3 | 0.3 |
| Example 11 | 70 | 50 | 3 | 0.075 |

As can be seen from the results shown in Table 3, the destruction of the pattern hardly occurs by development treatment under heating and moistening conditions, that is, the adhesion of the pattern to the substrate is improved.

Example 12

According to the procedure described in the Reference Example, a modified poly(sil sesquiazane) comprising —[SiCH$_3$(NH)$_{1.5}$]— as a basic constituent unit, 5 mol-% of —[Si(CH$_3$)$_3$(NH)$_{0.5}$]— and 1 mol-% of —[Si(CH$_3$)$_2$NH]— was prepared. To this modified poly(sil sesquiazane), a triazine derivative represented by the formula:

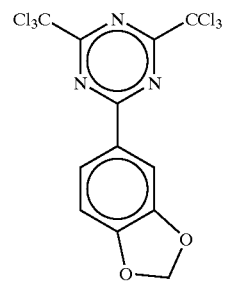

was added as a photo acid generator in an amount of 1% by weight, and this mixture was diluted with propylene glycol monomethyl ether acetate (PGMEA) such that the total solid content was reduced to 10% by weight, to prepare a radiation sensitive polysilazane composition. This radiation sensitive polysilazane composition was spin-coated at 1000 rpm onto a silicon substrate, and then pre-baked at 90° C. for 90 seconds to form a coating film of 0.4 μm in thickness. Then, the coating film was wholly exposed once with an irradiation amount of 100 mJ/cm$^2$ by a low-pressure mercury lamp. The coating film was subjected to moistening treatment at 25° C. at 50% RH for 5 minutes and burned at 400° C. for 30 minutes. The resulting burned film was examined for its dielectric constant and for the presence of remaining Si—NH linkages. The results are shown in Table 4.

Figure 4:
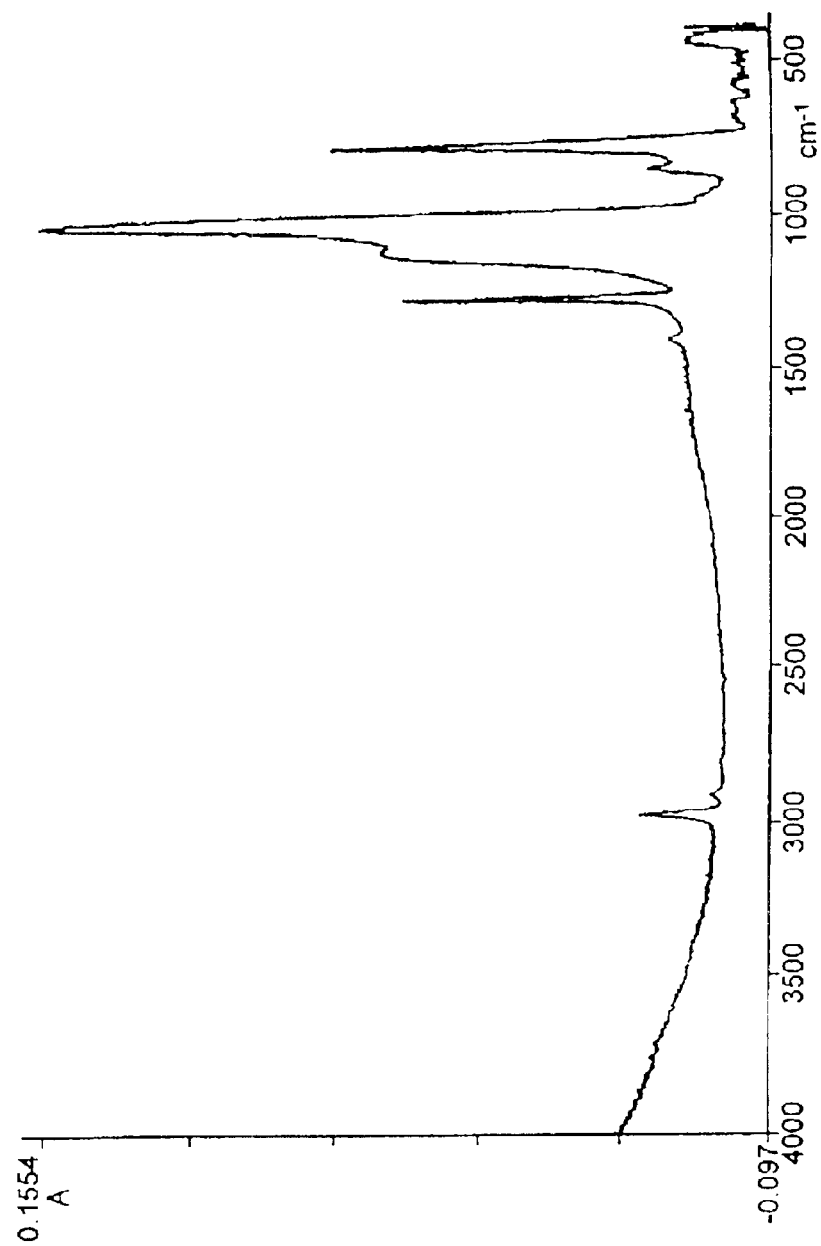
FIG. 4 is an IR absorption spectrum of a burned film formed in Examples in the present-invention.

The presence of remaining Si—NH linkages was determined by taking an IR absorption spectrum of the burned film with an IR spectrophotometer. The IR absorption spectrum of the burned film is shown in FIG. 4.

Comparative Example 4

Figure 5:
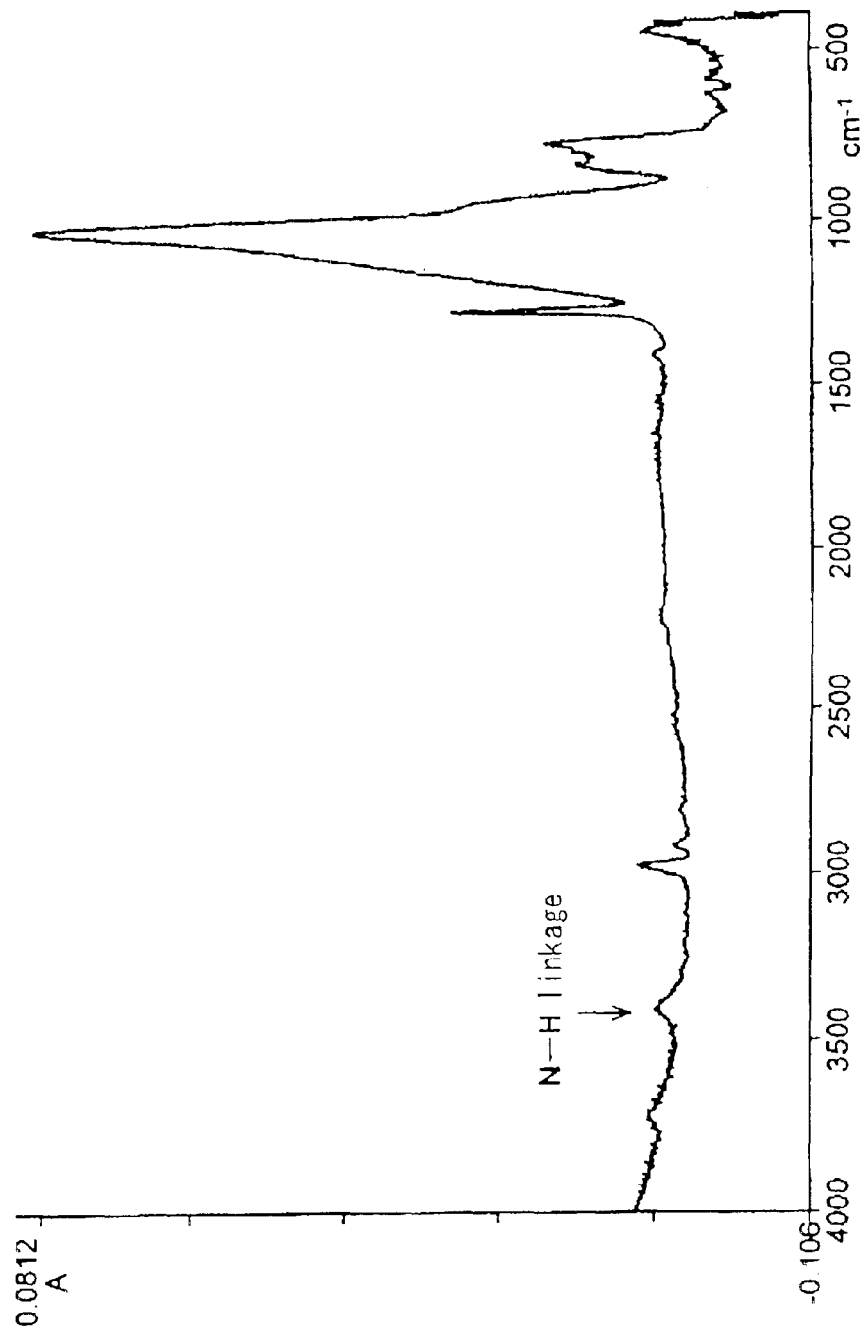
FIG. 5 is an IR absorption spectrum of a burned film formed in Comparative Examples.

The same procedure as in Example 12 was conducted except that the wholly exposure and the moistening treatment were not conducted, and the results shown in Table 4 were obtained. An IR absorption spectrum of the burned film formed in Comparative Example 4 is shown in FIG. 5.

TABLE 4

|  | Example 12 | Comparative Example 4 |
|---|---|---|
| Pretreatment condition for burning (wholly exposure) | Low-pressure mercury lamp 100 mJ/cm² | Not treated |
| Pretreatment condition for burning (Moistening treatment) | 25° C. at 50% RH for 5 minutes | Not treated |
| Burning conditions | 400° C. for 30 minutes | 400° C. for 30 minutes |
| Dielectric constant | 2.7 | 3.8 |
| Remaining Si—NH (IR spectrometry) | Absent (see FIG. 4) | present (see FIG. 5) |

As can be seen from the results shown in Table 4, the burned film having a low dielectric constant and free of Si—NH linkages in the film can be formed by subjecting the radiation sensitive polysilazane coating film before burning to exposure and moistening treatment.

Examples 13 to 15

According to the procedure described in the Reference Example, a modified poly(sil sesquiazane) comprising —[SiCH₃(NH)₁.₅]— as a basic constituent unit and 20 mol-% of —[Si(CH₃)₂NH]— was prepared. To this modified poly(sil sesquiazane), a sulfoxime derivative represented by the formula:

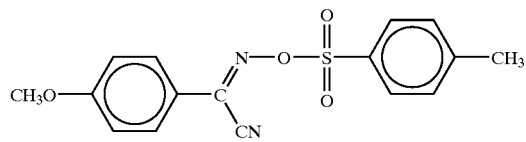

was added as a photo acid generator in an amount of 1% by weight, and this mixture was diluted with PGMEA such that the total solid content was reduced to 10% by weight to prepare a radiation sensitive polysilazane composition. This radiation sensitive polysilazane composition was spin-coated at 1000 rpm onto a silicon substrate and dried by spin-drying, to form a coating film of 0.4 μm in thickness. Then, the coating film was wholly exposed once to an irradiation amount of 100 mJ/cm² by a high-pressure mercury lamp. The exposed substrate was placed on a heating plate in a moistening treatment apparatus, then treated under the moistening conditions shown in Table 5 and burned at 400° C. for 30 minutes. The resulting burned film was examined in the same manner as in Example 12 for its dielectric constant and for the presence of remaining Si—NH linkages. The results are shown in Table 5.

Comparative Example 5

The same procedure as in Example 13 was conducted except that the moistening treatment conditions were those shown in Table 5, and the results in Table 5 were obtained.

TABLE 5

|  | Example 13 | Example 14 | Example 15 | Comparative Example 5 |
|---|---|---|---|---|
| Pretreatment condition for burning (wholly Exposure) | low-pressure mercury lamp 100 mJ/cm² | low-pressure mercury lamp 100 mJ/cm² | low-pressure mercury lamp 100 mJ/cm² | Not treated |
| Pretreatment condition for burning (Moistening treatment) | 25° C. at 50% RH for 1 minute | 30° C. at 80% RH for 1 minute | 70° C. at 50% RH for 1 minute | Not treated |
| Burning conditions | 400° C. for 30 minutes | 400° C. for 30 minutes | 400° C. for 30 minutes | 400° C. for 30 minutes |
| Dielectric constant | 3.3 | 2.7 | 2.7 | 3.8 |
| Remaining Si—NH (IR spectrometry) | Present | Absent | Absent | present |

As can be seen from the results shown in Table 5, the burned film having a low dielectric constant and free of Si—NH linkages in the film can be formed by the moistening treatment at high humidity or by the moistening treatment under heating, as opposed to the moistening treatment at low humidity and at low temperature. As can also be seen from this result, the process time can be shortened by the moistening treatment at high humidity under heating.

EFFECT OF THE INVENTION

As illustrated above, the following effects are obtained according to the present invention.

(1) The treatment for promoting decomposition of the polysilazane after exposure of the radiation sensitive polysilazane composition is conducted using a vapor water-containing gas, whereby the moistening treatment can be conducted in a short time. Further, by increasing the humidity of the gas, the sensitivity can be improved and the treatment time can be shortened. Further, by the moistening treatment of the coating film on a substrate in a heated state, the treatment under higher humidity conditions is feasible, to achieve the effects of further improvements in sensitivity, an increase in the rate of processing, and improvements in the adhesion between the substrate and the radiation sensitive polysilazane composition.

(2) When the radiation sensitive polysilazane coating film which was patterned or not patterned is burned, the radiation sensitive polysilazane coating film is subjected to exposure to light and moistening treatment in the pretreatment step before burning, whereby a silica type ceramic film with a low dielectric constant excellent in insulating properties, heat resistance, abrasion resistance, corrosion resistance and transparency and free of Si—N linkages derived from the polysilazane in the burned film can be formed by heating at low temperature in a short time. Further, a highly humid gas is used in the moistening treatment as the pretreatment step for burning, or the radiation sensitive polysilazane coating film is heated during moistening treatment, whereby shorter time conversion of the polysilazane in the film into SiOH proceeds, and the treatment time can be reduced as a whole.

(3) By adding a water-soluble compound as a shape stabilizer to the radiation sensitive polysilazane composition comprising a specific modified poly(sil sesquiazane), the difference in sensitivity of the radiation sensitive composition in the direction of film thickness can be solved, whereby the side wall of the pattern section in the pattern formed by exposure can be made steep to improve pattern resolution.

Further, the resultant insulating film can serve as a finely patterned film having a low dielectric constant, excellent in mechanical characteristics such as abrasion resistance and excellent as an inter-layer dielectric.

(4) The patterned polysilazane film obtained according to the method of forming a pattern or the novel radiation sensitive polysilazane composition of the present invention can be used directly as a resist such as etching resist or as a coating constituting displays, and the film can also be converted into a silica type ceramic film which can be used as an inter-layer dielectric or the like in semiconductor devices or LCD.

What is claimed is:

1. A method of forming a patterned polysilazane film by exposing and then developing a coating film of a radiation sensitive polysilazane composition, wherein the exposed radiation sensitive polysilazane coating film is contacted with a gas containing water vapor with relative humidity to the temperature of the substrate of from 35% RH to 90% RH and then developed.

2. The method of forming a patterned polysilazane film according to claim 1, wherein the radiation sensitive polysilazane coating film is heated at the time of the contact with a gas containing water vapor.

3. A method of burning a radiation sensitive polysilazane coating film, wherein the steps of exposing with light and moistening by contacting with a gas containing water vapor with relative humidity to the temperature of the substrate of from 35% RH to 90% RH the radiation sensitive polysilazane coating film are provided as pretreatment steps for burning and then said exposed and moistened radiation sensitive polysilazane coating film is burned.

4. The method of burning a radiation sensitive polysilazane coating film according to claim 3, wherein the radiation sensitive polysilazane coating film has been patterned.

5. The method of burning a radiation sensitive polysilazane coating film according to claim 3, wherein the radiation sensitive polysilazane coating film is heated at the time of the moistening treatment.

6. A radiation sensitive polysilazane composition comprising a modified poly(sil sesquiazane) having a number average molecular weight of 100 to 100,000 and containing a basic constituent unit represented by the general formula: —[SiR$^6$(NR$^7$)$_{1.5}$]— and other constituent units represented by the general formula: —[SiR$^6_2$NR$^7$]— and/or —[SiR$^6_3$(NR$^7$)$_{0.5}$]— (in the aforementioned formulae, R$^6$ independently represents a C$_{1-3}$ alkyl group or a substituted or unsubstituted phenyl group and R$^7$ independently represents a hydrogen atom, a C$_{1-3}$ alkyl group or a substituted or unsubstituted phenyl group) in a ratio of 0.1 to 100 mol-% to said basic constituent unit, a photo acid generator, and a water-soluble compound as a shape stabilizer.

7. The radiation sensitive polysilazane composition according to claim 6, wherein the photo acid generator is ones selected from the group consisting of a sulfoxime type compound and a triazine type compound.

8. The radiation sensitive polysilazane composition according to claim 6, which further comprises a dissolution inhibitor.

9. The radiation sensitive polysilazane composition according to claim 8, wherein the dissolution inhibitor is ones selected from the group consisting of t-butoxycarbonylated catechol, t-butoxycarbonylated hydroquinone, t-butyl ester of benzophenone-4,4'-dicarboxylic acid, and t-butyl ester of 4,4'-oxydibenzoic acid, and is contained in an amount of 0.1 to 40% by weight relative to the radiation sensitive polysilazane composition.

10. The radiation sensitive polysilazane composition according to of claim 6, wherein the water-soluble compound is a compound with a nitro group.

11. The radiation sensitive polysilazane composition according to claim 6, wherein the water-soluble compound is a compound containing a carbonate.

12. The radiation sensitive polysilazane composition according to claim 6, which further comprises a sensitizing dye.

13. The radiation sensitive polysilazane composition according to claim 6, wherein the radiation sensitive polysilazane composition is used as an inter-layer dielectric.

14. A method of forming a patterned inter-layer dielectric, which comprises forming a coating film of a radiation sensitive polysilazane composition comprising a modified poly(sil sesquiazane) having a number average molecular weight of 100 to 100,000 and containing a basic constituent unit represented by the general formula: —[SiR$^6$(NR$^7$)$_{1.5}$]— and other constituent units represented by the general formula: —[SiR$^6_2$NR$^7$]— and/or —[SiR$^6_3$(NR$^7$)$_{0.5}$]— (in the aforementioned formulae, R$^6$ independently represents a C$_{1-3}$ alkyl group or a substituted or unsubstituted phenyl group and R$^7$ independently represents a hydrogen atom, a C$_{1-3}$ alkyl group or a substituted or unsubstituted phenyl group) in a ratio of 0.1 to 100 mol-% to said basic constituent unit, a photo acid generator, and a water-soluble compound as a shape stabilizer, patternwise irradiating the coating film, dissolving and removing the irradiated part of the coating film, and leaving the residual patterned coating film in the ambient atmosphere or burning the coating film.

* * * * *